(12) United States Patent
Liu et al.

(10) Patent No.: US 11,437,447 B2
(45) Date of Patent: Sep. 6, 2022

(54) DISPLAY DEVICE AND MANUFACTURING METHOD THEREOF

(71) Applicant: Xiamen Tianma Micro-Electronics Co., Ltd., Xiamen (CN)

(72) Inventors: Bingping Liu, Xiamen (CN); Xiaoxiao Wu, Xiamen (CN); Guozhao Chen, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

(21) Appl. No.: 17/203,064

(22) Filed: Mar. 16, 2021

(65) Prior Publication Data

US 2021/0225948 A1 Jul. 22, 2021

(30) Foreign Application Priority Data

Nov. 30, 2020 (CN) .......................... 202011384870.5

(51) Int. Cl.
*H01L 27/32* (2006.01)
*H01L 51/52* (2006.01)
(Continued)

(52) U.S. Cl.
CPC ........ *H01L 27/323* (2013.01); *G06V 40/1324* (2022.01); *H01L 51/5275* (2013.01); *H01L 51/5284* (2013.01); *H01L 51/56* (2013.01)

(58) Field of Classification Search
CPC ............... H01L 27/323; H01L 51/5284; H01L 51/5275; H01L 51/56; H01L 27/3272;
(Continued)

(56) References Cited

U.S. PATENT DOCUMENTS 10,665,631 B1 * 5/2020 Cai .................... G06V 40/1318
2018/0005005 A1 * 1/2018 He ......................... G06F 3/0418
(Continued)

FOREIGN PATENT DOCUMENTS

| CN | 106886767 B | 7/2019 |
| CN | 110376782 A | 10/2019 |

(Continued)

*Primary Examiner* — Muhammad N Edun
(74) *Attorney, Agent, or Firm* — von Briesen & Roper, s.c.

(57) ABSTRACT

Provided are a display device and a manufacturing method thereof. The display device includes an organic light-emitting display panel and a fingerprint identification assembly disposed on a non-light-emitting display side of the organic light-emitting display panel. The fingerprint identification assembly includes a first substrate, a fingerprint identification unit and a light-shielding structure. The fingerprint identification unit and the light-shielding structure are disposed on a same side of the first substrate. The light-shielding structure is disposed between the fingerprint identification unit and the organic light-emitting display panel; the light-shielding structure includes at least two light-shielding layers, each light-shielding layer includes light-transmissive portions and at least one light-shielding portion, and the light-transmissive portions are at least partially surrounded by the light-shielding portion; in a direction perpendicular to the first substrate, positions of light-transmissive portions in one light-shielding layer are in one-to-one correspondence with positions of light-transmissive portions in another one light-shielding layer.

19 Claims, 17 Drawing Sheets

(51) Int. Cl.
 *H01L 51/56* (2006.01)
 *G06V 40/13* (2022.01)
(58) Field of Classification Search
 CPC ............ H01L 27/3234; H01L 27/3227; H01L 27/3244; H01L 2227/323; G06V 40/1318; G06V 40/1324
 See application file for complete search history.

(56) References Cited

U.S. PATENT DOCUMENTS

2019/0012555 A1* 1/2019 Bae .................... G06V 40/1318
2019/0019000 A1* 1/2019 Lee ......................... G02B 5/20
2019/0095674 A1* 3/2019 Ko ..................... G02B 19/0009

FOREIGN PATENT DOCUMENTS

TW 200730801 A 8/2007
WO 2019085859 A1 5/2019

* cited by examiner

DISPLAY DEVICE AND MANUFACTURING METHOD THEREOF

CROSS-REFERENCE TO RELATED APPLICATION

This application claims priority to Chinese Patent Application No. 202011384870.5 filed Nov. 30, 2020, the disclosure of which is incorporated herein by reference in its entirety.

TECHNICAL FIELD

The present disclosure relates to the field of display technologies and, in particular, to a display device and a manufacturing method thereof.

BACKGROUND

A fingerprint of anybody is inherent and unique. With the development of science and technology, there are various display devices having fingerprint identification functions in the market. Such display devices include mobile phones, tablet computers and smart wearable equipment. In this way, a user only needs to touch a particular region of a display device having a fingerprint identification function with a figure before operating this device, and a permission of the user can be verified through identification of a fingerprint identification unit, simplifying the permission verification process.

At present, products based on optical fingerprint identification technologies are mainly applied to organic light-emitting display panels. A fingerprint identifier is usually externally hung under the organic light-emitting display panel, and a collimating film is attached between the fingerprint identifier and the organic light-emitting display panel to ensure the quality of fingerprint identification. The cost of the existing collimating film is relatively high and the process of assembling the collimating film, the fingerprint identifier and the organic light-emitting display panel is complicated.

SUMMARY

The present disclosure provides a display device and a manufacturing method thereof, reducing the cost of manufacturing the display device and simplifying the process flow of manufacturing the display device.

In a first aspect, an embodiment of the present disclosure provides a display device. The display device includes an organic light-emitting display panel and a fingerprint identification assembly disposed on a non-light-emitting display side of the organic light-emitting display panel.

The fingerprint identification assembly includes a first substrate, a fingerprint identification unit and a light-shielding structure, and the fingerprint identification unit and the light-shielding structure are disposed on a same side of the first substrate.

The light-shielding structure is disposed between the fingerprint identification unit and the organic light-emitting display panel; the light-shielding structure includes at least two light-shielding layers, each of the at least two light-shielding layers includes light-transmissive portions and at least one light-shielding portion, and the light-transmissive portions are at least partially surrounded by the at least one light-shielding portion; and in a direction perpendicular to the first substrate, positions of light-transmissive portions in one of the at least two light-shielding layers are in one-to-one correspondence with positions of light-transmissive portions in another one of the at least two light-shielding layers.

In a second aspect, an embodiment of the present disclosure provides a manufacturing method of a display device. The method includes steps described below.

An organic light-emitting display panel is provided.

A first substrate is provided.

A fingerprint identification unit and a light-shielding structure are formed on a side of the first substrate.

The first substrate on which the fingerprint identification unit and the light-shielding structure are formed is secured to a non-light-emitting display side of the organic light-emitting display panel.

The light-shielding structure includes at least two light-shielding layers, each of the at least two light-shielding layers includes light-transmissive portions and at least one light-shielding portion, and the light-transmissive portions are at least partially surrounded by the at least one light-shielding portion; and in a direction perpendicular to the first substrate, positions of light-transmissive portions in one of the at least two light-shielding layers are in one-to-one correspondence with positions of light-transmissive portions in another one of the at least two light-shielding layers.

In a third aspect, an embodiment of the present disclosure provides a manufacturing method of a display device. The method includes steps described blow.

An organic light-emitting display panel is provided.

A first substrate is provided.

A fingerprint identification unit is formed on a side of the first substrate.

A second substrate is provided.

A plurality of first grooves are formed on the second substrate.

A lens array is formed in the plurality of first grooves.

A light-shielding structure is formed on a side of the second substrate.

The side of the second substrate on which the light-shielding structure is formed is bonded to the side of the first substrate on which the fingerprint identification unit is formed by a second encapsulant which is annular in shape.

The first substrate on which the fingerprint identification unit and the light-shielding structure are formed is secured to a non-light-emitting display side of the organic light-emitting display panel.

The light-shielding structure includes at least two light-shielding layers, each of the at least two light-shielding layers includes light-transmissive portions and at least one light-shielding portion, and the light-transmissive portions are at least partially surrounded by the at least one light-shielding portion; and in a direction perpendicular to the first substrate, positions of light-transmissive portions in one of the at least two light-shielding layers are in one-to-one correspondence with positions of light-transmissive portions in another one of the at least two light-shielding layers. The lens array is disposed between the light-shielding structure and the organic light-emitting display panel. The lens array includes a plurality of converging lens, and in the direction perpendicular to the first substrate, each of the plurality of converging lenses covers at least one of the light-transmissive portions in a same one of the at least two light-shielding layers.

According to the display device provided in the embodiment of the present disclosure, the light-shielding structure is disposed in the fingerprint identification assembly, and the fingerprint identification unit and the light-shielding structure are disposed on the same side of the first substrate and are integrated together, so that a collimating film is not required to be purchased separately, the cost of manufacturing the display device is reduced, and the process flow of manufacturing the display device is simplified.

DETAILED DESCRIPTION

Figure 1:
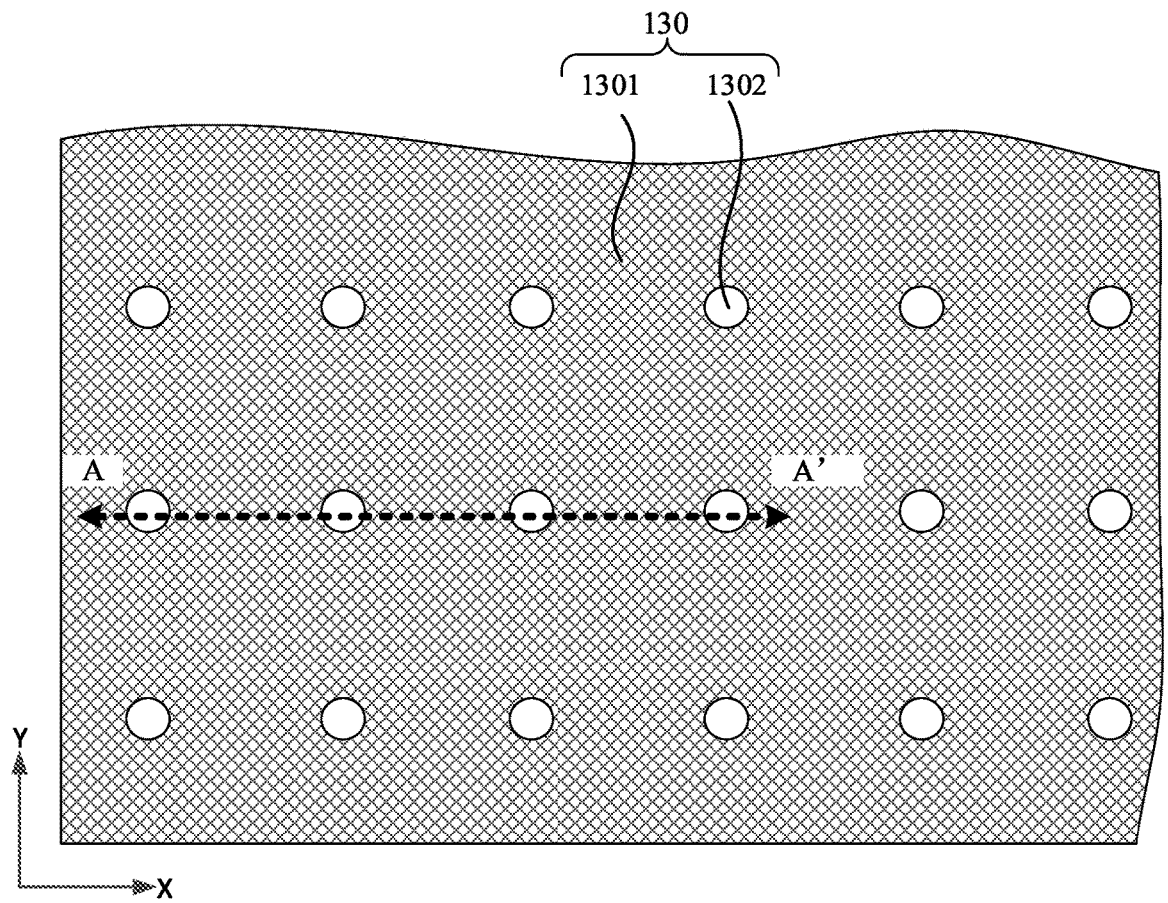
FIG. 1 is a top view of a display device according to an embodiment of the present disclosure.

Hereinafter the present disclosure will be further described in detail in conjunction with drawings and embodiments. It is to be understood that the embodiments set forth herein are intended to explain the present disclosure and not to limit the present disclosure. Additionally, it is to be noted that for ease of description, merely part, not all, of the structures related to the present disclosure are illustrated in the drawings.

In the field of display technologies, a collimating film may be integrated in a liquid crystal display panel in order to improve the degree of integration. An organic light-emitting display panel has a more complicated driver circuit. If the collimating film is integrated inside the organic light-emitting display panel, the aperture ratio of the organic light-emitting display panel will be sacrificed. Therefore, an independent fingerprint identifier and an independent collimating film are usually externally hung under the organic light-emitting display panel. The cost of the existing collimating film is relatively high. The process of bonding and assembling the collimating film, the fingerprint identifier and the organic light-emitting display panel is complicated.

Figure 2:
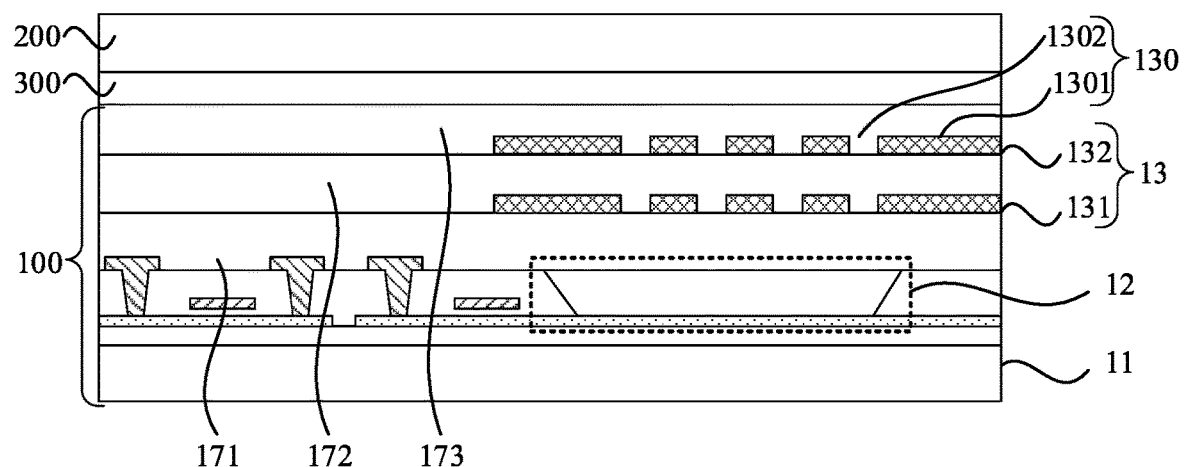
FIG. 2 is a sectional view of the display device along section line AA' of FIG. 1.

FIG. 1 is a top view of a display device according to an embodiment of the present disclosure. FIG. 2 is a sectional view of the display device along section line AA' of FIG. 1. Referring to FIG. 1 and FIG. 2, structures such as a light-shielding structure 13 and a fingerprint identification unit 12 are omitted in FIG. 1, and one fingerprint identification unit 12 is used as an example for explanation in FIG. 2, but the display device may also include a plurality of fingerprint identification units 12 without being limited thereto. The display device includes an organic light-emitting display panel 200 and a fingerprint identification assembly 100. The fingerprint identification assembly 100 is disposed on a non-light-emitting display side of the organic light-emitting display panel 200. The organic light-emitting display panel 200 may include structures such as an organic light-emitting material layer and implement an image display function when the organic light-emitting material layer emits light. The fingerprint identification assembly 100 is disposed facing away from the light-emitting display side of the organic light-emitting display panel 200. Therefore, when a user touches the light-emitting display side of the organic light-emitting display panel 200 in the display device, fingerprint signal light reflected by a touch body (e.g., a finger) may pass through the organic light-emitting display panel 200 and reach the fingerprint identification assembly 100, and the fingerprint identification assembly 100 implements fingerprint identification according to the received fingerprint signal light.

With continued reference to FIG. 2, the fingerprint identification assembly 100 includes a first substrate 11, the fingerprint identification unit 12 and the light-shielding structure 13; the fingerprint identification unit 12 and the light-shielding structure 13 are disposed on the same side of the first substrate 11. The light-shielding structure 13 is disposed between the fingerprint identification unit 12 and the organic light-emitting display panel 200. The light-shielding structure 13 includes at least two light-shielding layers 130. The light-shielding layer 130 includes a light-transmissive portion 1302 and a light-shielding portion 1301. The light-transmissive portion 1302 is at least partially surrounded by the light-shielding portion 1301. In a direction perpendicular to the first substrate 11, positions of light-transmissive portions 1302 in one light-shielding layer 130 are in one-to-one correspondence with positions of light-transmissive portions 1302 in another one light-shielding layer 130. The fingerprint signal light reflected by the touch body can only be projected onto the fingerprint identification unit 12 after passing through the light-transmissive portions 1302 of all the light-shielding layers 130, so the light-shielding structure 13 plays a role of limiting large-angle light to be collimating. The light-shielding layer 130 may include a reflective material and/or a light-absorbing material to prevent light irradiating thereon from passing through the light-shielding layer 130. The light-transmissive portion 1302 may be an aperture in a reflective material layer or a light-absorbing material layer, and in some implementations, a transparent dielectric may also be filled in the aperture of the reflective material layer or the light-absorbing material layer.

According to the display device provided in the embodiment of the present disclosure, the light-shielding structure 13 is disposed in the fingerprint identification assembly 100, and the fingerprint identification unit 12 and the light-shielding structure 13 are disposed on the same side of the first substrate 11 and are integrated together, so that the collimating film is not required to be purchased separately, the cost of manufacturing the display device is reduced, and the process flow of manufacturing the display device is simplified.

In an embodiment, referring to FIG. 1, the light-shielding portion 1301 encircles a plurality of light-transmissive portions 1302, the plurality of light-transmissive portions 1302 are arranged in an array in a first direction X and a second direction Y, and the first direction X intersects the second direction Y. Since the plurality of light-transmissive portions 1302 are arranged in the array in the first direction X and the second direction Y, the light-shielding portion 1301 can shield, in the first direction X and the second direction Y, all the large-angle light obliquely incident to the light-shielding layer 130. In some implementations, the first direction X may be perpendicular to the second direction Y. In other implementations, the first direction X may not be perpendicular to the second direction Y, and the included angle between the first direction X and the second direction Y is a certain value between 0° and 90°.

Figure 3:
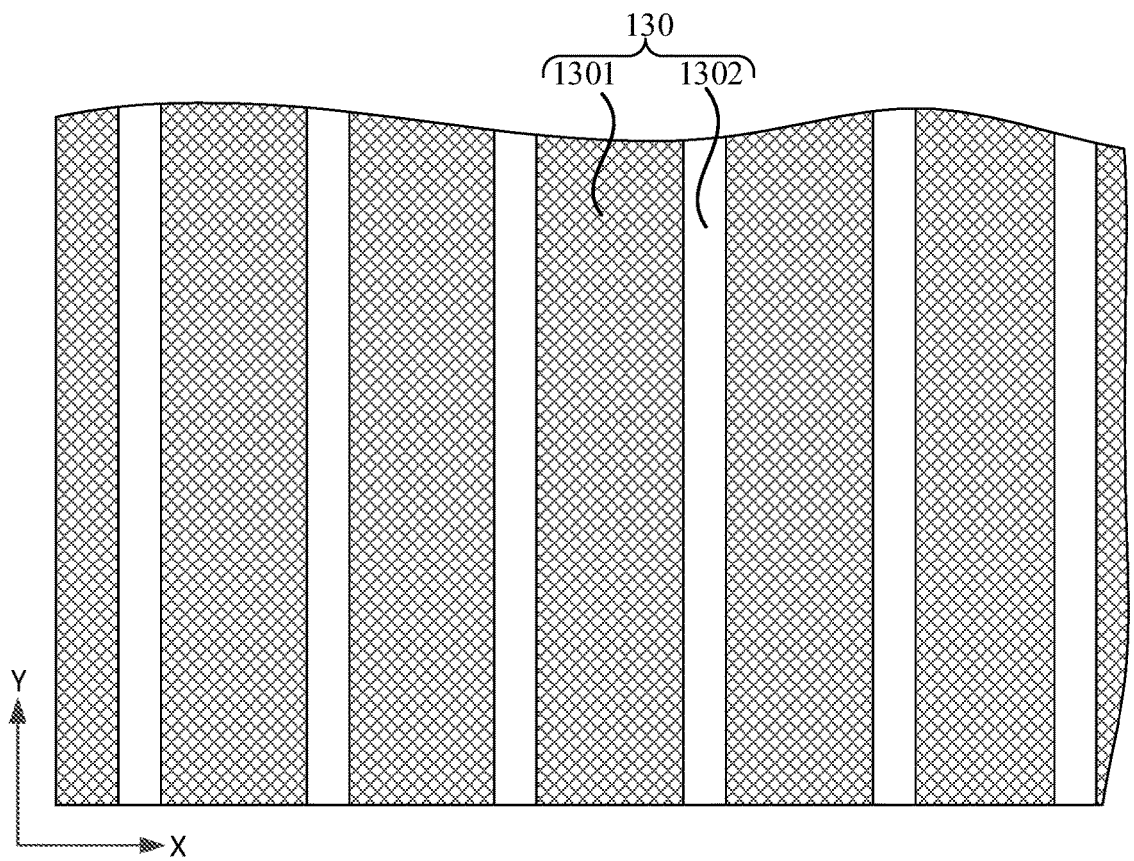
FIG. 3 is a top view of another display device according to an embodiment of the present disclosure.

FIG. 3 is a top view of another display device according to an embodiment of the present disclosure. Referring to FIG. 3, light-transmissive portions 1302 are formed into light-transmissive strips. The light-transmissive strips extend in the second direction Y and are arranged in the first direction X. The first direction X intersects the second direction Y. Since the light-transmissive strips extend in the second direction Y and are arranged in the first direction X, the light-shielding portion 1301 can shield, in the first direction, the large-angle light obliquely incident to the light-shielding layer 130. In other implementations, the light-transmissive strips formed from the light-transmissive portions 1302 may also extend in the first direction X and are arranged in the second direction Y.

Exemplarily, the light-shielding structure 13 includes a first light-shielding layer 131 and a second light-shielding layer 132, and the first light-shielding layer 131 may have a plurality of light-transmissive holes arranged in an array, a plurality of light-transmissive strips extending in the first direction X, or a plurality of light-transmissive strips extending in the second direction Y. The second light-shielding layer 132 may have a plurality of light-transmissive holes arranged in an array, a plurality of light-transmissive strips extending in the first direction X, or a plurality of light-transmissive strips extending in the second direction Y. The first light-shielding layer 131 and the second light-shielding layer 132 may have the same structure or different structures.

Figure 4:
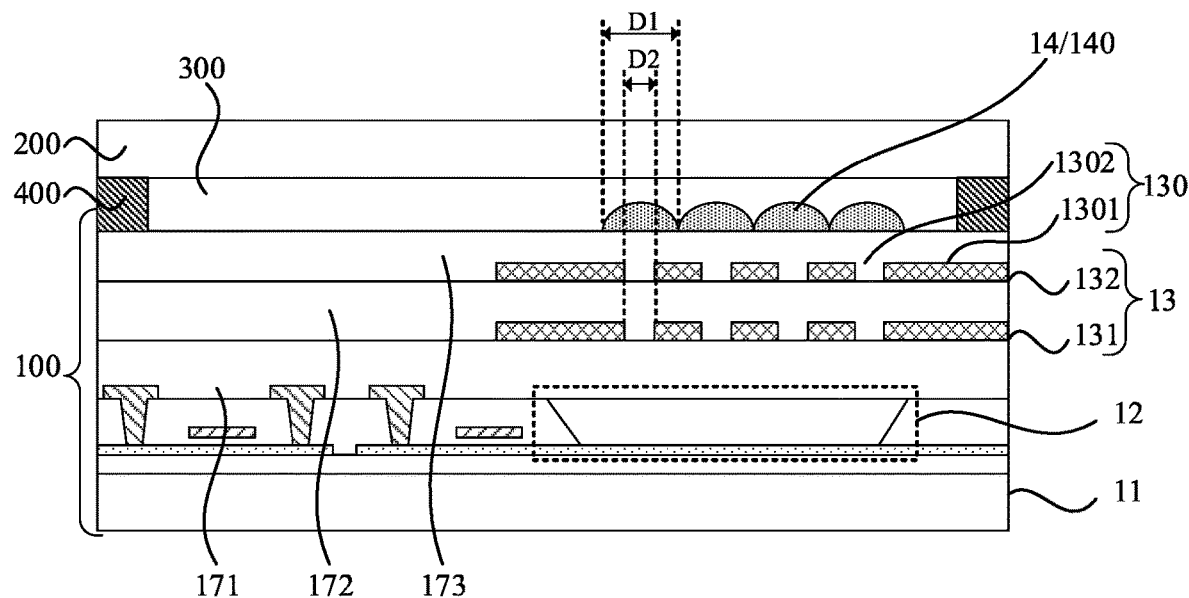
FIG. 4 is a sectional view of another display device according to an embodiment of the present disclosure.
Figure 5:
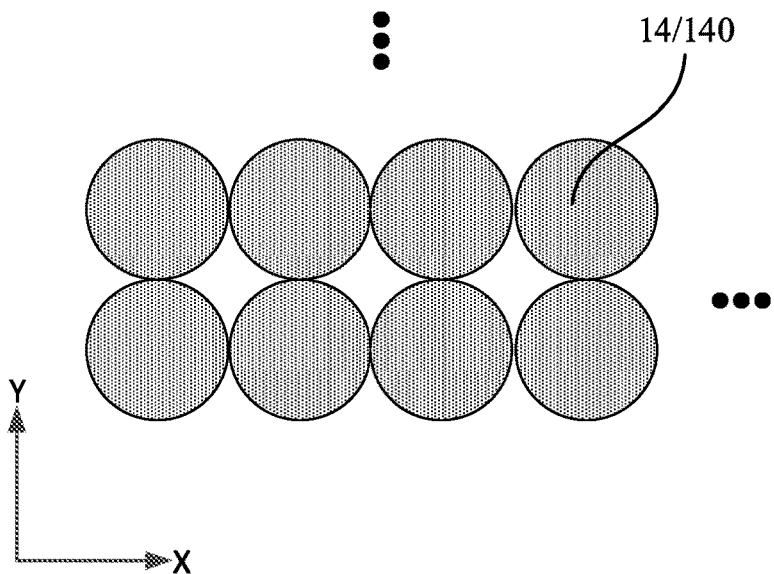
FIG. 5 is a top view illustrating a lens array of FIG. 4.

FIG. 4 is a sectional view of another display device according to an embodiment of the present disclosure. FIG. 5 is a top view illustrating a lens array of FIG. 4. Referring to FIG. 4 and FIG. 5, the display device further includes a lens array 14 disposed between the light-shielding structure 13 and the organic light-emitting display panel 200. The lens array 14 includes a plurality of converging lenses 140 which may be disposed in the same layer and may be formed in the same process by using the same material. In the direction perpendicular to the first substrate 11, the converging lens 140 covers at least one light-transmissive portion 1302 in a same light-shielding layer 130. That is, the vertical projection of at least one light-transmissive portion 1302 in the same light-shielding layer 130 on the first substrate 11 is within the vertical projection of the converging lens 140 on the first substrate 11. In the embodiment of the present disclosure, the display device includes the light-shielding structure 13 and the lens array 14, and the lens array 14 is disposed between the light-shielding structure 13 and the organic light-emitting display panel 200, so that the fingerprint signal light reflected by the touch body is projected into the light-transmissive portion 1302 in the light-shielding structure 13 after being converged by the converging lens 140 in the lens array 14. Since the converging lens 140 has a light converging function, the intensity of the fingerprint signal light projected into the light-transmissive portion 1302 is increased, thereby improving the accuracy of fingerprint identification. Further, the converging lens 140 also converges the large-angle oblique incident light to the light-shielding portion 1301 to prevent the large-angle light from being projected to the fingerprint identification unit 12, thus avoiding the occurrence of a crosstalk phenomenon.

In an embodiment, referring to FIG. 4 and FIG. 5, the converging lens 140 is hemispherical in shape and may be a hemisphere or a spherical cap, where the hemisphere is a structure obtained from intercepting a sphere by a plane passing through the center of the sphere, and the spherical cap is a structure obtained from intercepting the sphere by a plane not passing through the center of the sphere. The plurality of converging lenses 140 are arranged in an array in the first direction X and the second direction Y, and the first direction X intersects the second direction Y. Since the converging lens 140 is hemispherical in shape, the converging lens 140 has a light converging effect in any direction on the XY plane. In other implementations, the converging lens 140 may also be semi-cylindrical in shape; the converging lenses 140 may extend in the second direction Y and be arranged in the first direction X or may extend in the first direction X and be arranged in the second direction Y.

In an embodiment, referring to FIG. 4, the converging lens 140 has a diameter of D1, and 4 µm≤D1≤8 µm. The diameter of the converging lens 140 refers to a diameter of a circle formed by the projection of the converging lens 140 in the direction perpendicular to the first substrate 11, that is, a diameter of a circle formed by the edge of the converging lens 140 parallel to the surface of the first substrate 11. The light-transmissive portion 1302 is circular in shape and has a diameter of D2, and 2 µm≤D2≤5 µm. In the embodiment of the present disclosure, 4 µm≤D1≤8 µm, 2 µm≤D2≤5 µm, 1.25≤D1/D2≤4, and the diameter D1 of the converging lens 140 is greater than the diameter D2 of the light-transmissive portion 1302, so that the converging lens 140 covers the entire light-transmissive portion 1302. On the other hand, the diameter D1 of the converging lens 140 may be less than four times the diameter D2 of the light-transmissive portion 1302 so that the diameter D1 of the converging lens 140 is not too large, thereby avoiding the formation of a converging lens 140 with too large a height and facilitating the reduction of the process difficulty in forming the converging lens 140.

In an embodiment, referring to FIG. 4 and FIG. 5, in the direction perpendicular to the first substrate 11, the number of converging lenses 140 covered by each fingerprint identification unit 12 is greater than or equal to six and is less than or equal to nine. That is, the vertical projections of six to nine converging lenses 140 on the first substrate 11 are within the vertical projection of a same fingerprint identification unit 12 on the first substrate 11. If too few converging lenses 140 are disposed, the converging lenses 140 have a greater height, and the process difficulty in forming the converging lenses 140 is increased. If too many converging lenses 140 are disposed, the converging lenses 140 have too small a height and have weak light converging capability and collimation capability. In the embodiment of the present disclosure, the number of converging lenses 140 covered by each fingerprint identification unit 12 is greater than or equal to six and is less than or equal to nine, not only reducing the process difficulty in forming the converging lenses 140 but also ensuring that the converging lenses 140 have strong light converging capability and collimation capability.

Exemplarily, referring to FIG. 4, in the direction perpendicular to the first substrate 11, the light-transmissive portion 1302 in the light-shielding layer 130 and the converging lens 140 overlap in one-to-one correspondence. The light-transmissive portions 1302 has a one-to-one correspondence with the converging lens 140. The light-transmissive portion 1302 and the converging lens 140 which are in one-to-one correspondence are disposed opposite each other.

Exemplarily, referring to FIG. 4 and FIG. 5, the converging lens 140 is hemispherical in shape, the plurality of converging lenses 140 are arranged in the array in the first direction X and the second direction Y, and the converging lenses 140 are located merely in the region where the fingerprint identification unit 12 is located. The vertical projections of the converging lenses 140 on the first substrate 11 are within the vertical projection of the fingerprint identification unit 12 on the first substrate 11.

Exemplarily, referring to FIG. 5, a plurality of converging lenses 140 are repeatedly arranged in the second direction Y. In other implementations, two adjacent rows of converging lenses 140 (i.e., two adjacent converging lens rows) may also be staggered in the second direction Y.

Figure 6:
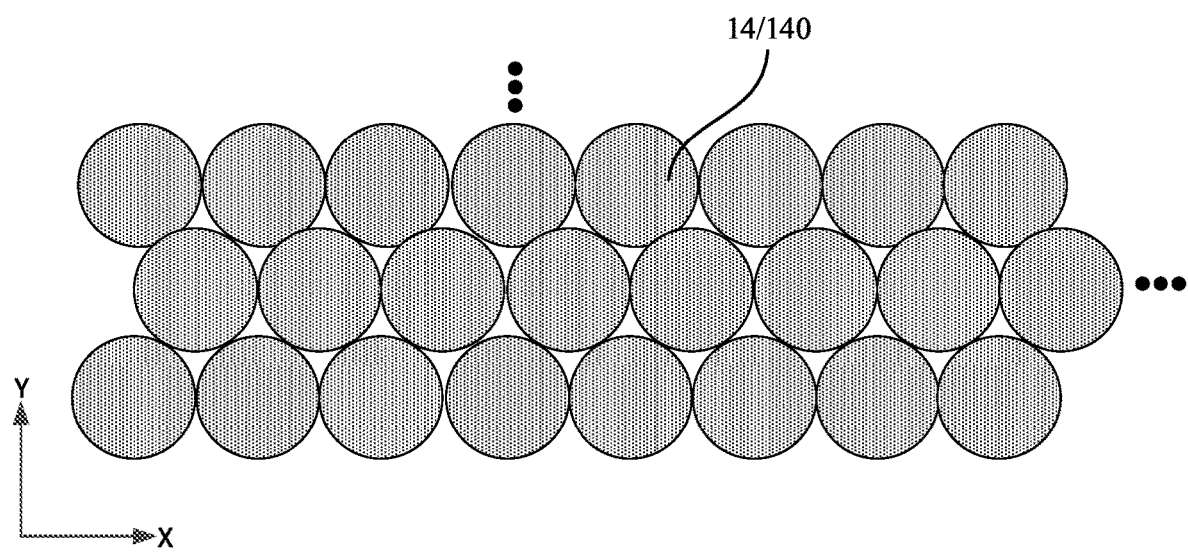
FIG. 6 is a top view of another lens array according to an embodiment of the present disclosure.

FIG. 6 is a top view of another lens array according to an embodiment of the present disclosure. Referring to FIG. 6, the converging lens 140 is hemispherical in shape, and a plurality of converging lenses 140 are arranged in an array in the first direction X and the second direction Y. The converging lenses 140 are located in the entire display region of the organic light-emitting display panel 200. Since it is not necessary to selectively dispose the converging lenses 140 merely in the region where the fingerprint identification unit 12 is located, the difficulty in disposing the converging lenses 140 is reduced.

Exemplarily, referring to FIG. 6, every two adjacent converging lenses 140 are in contact and thus form a converging lens row in the first direction X, and every two adjacent rows of converging lenses 140 (i.e., every two adjacent converging lens rows) are staggered in the second direction Y. That is, odd rows among rows of converging lens are repeatedly arranged in the second direction Y, even rows among the rows of converging lens are repeatedly arranged in the second direction Y, and an odd row of converging lenses and an even row of converging lenses which are adjacent to each other are staggered in the first direction X. One converging lens 140 in an even row is located in the gap between two converging lenses 140 in an odd row in the first direction X. Three adjacent converging lenses 140 in an even row and an odd row form a triangle.

Figure 7:
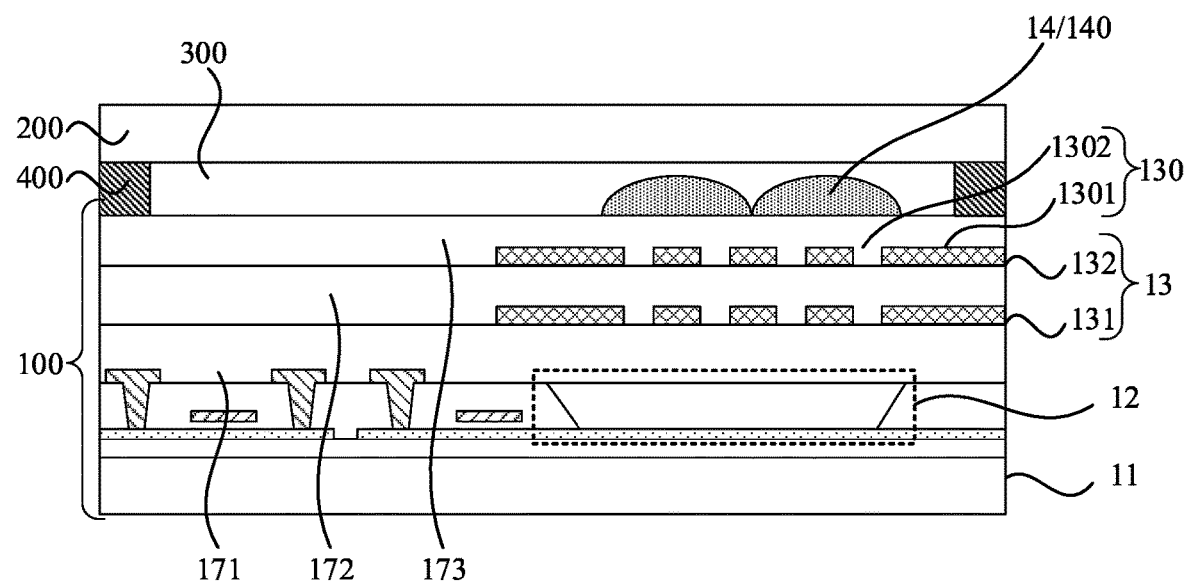
FIG. 7 is a sectional view of another display device according to an embodiment of the present disclosure.

FIG. 7 is a sectional view of another display device according to an embodiment of the present disclosure.

Referring to FIG. 7, a converging lens 140 covers a plurality of light-transmissive portions 1302 in a same light-shielding layer 130. In the direction perpendicular to the first substrate 11, at least two light-transmissive portions 1302 in the light-shielding layer 130 overlap with a same converging lens 140. The vertical projections of at least two light-transmissive portions 1302 on the first substrate 11 are within the vertical projection of the same converging lens 140 on the first substrate 11.

In an embodiment, referring to any one of FIG. 2, FIG. 4, and FIG. 7, the light-shielding structure 13 and the fingerprint identification unit 12 are both disposed between the first substrate 11 and the organic light-emitting display panel 200. In the embodiment of the present disclosure, the fingerprint identification unit 12 may be formed on the first substrate 11, or the fingerprint identification unit 12 and the light-shielding structure 13 are formed on the first substrate 11, and after the fingerprint identification assembly 100 and the organic light-emitting display panel 200 are bonded and assembled, the first substrate 11 is disposed on the side of the light-shielding structure 13 and the fingerprint identification unit 12 facing away from the organic light-emitting display panel 200, so that the first substrate 11 can serve as a protective layer for the light-shielding structure 13 and the fingerprint identification unit 12.

In an embodiment, referring to FIG. 4 or FIG. 7, the display device further includes the lens array 14 disposed between the light-shielding structure 13 and the organic light-emitting display panel 200. The lens array 14 is integrated on the first substrate 11. That is, the first substrate 11 is used as the base substrate, and the fingerprint identification unit 12, the light-shielding structure 13, and the lens array 14 are formed on the first substrate 11. In the embodiment of the present disclosure, the lens array 14 is integrated on the first substrate 11, so that when the lens array 14 is formed, no additional base substrate is required to be provided for the lens array 14, the process is saved, and the thickness of the display device is reduced.

Exemplarily, referring to FIG. 4 or FIG. 7, the display device further includes a first dielectric layer 171, a second dielectric layer 172, and a third dielectric layer 173, the first dielectric layer 171 is disposed between the fingerprint identification unit 12 and the first light-shielding layer 131, the second dielectric layer 173 is disposed between the first light-shielding layer 131 and the second light-shielding layer 132, and the third dielectric layer 173 is disposed between the second light-shielding layer 132 and the lens array 14.

Exemplarily, referring to FIG. 4 or FIG. 7, the display device further includes a pad 400 and an optical adhesive layer 300, and the pad 400 is disposed between the third dielectric layer 173 and the organic light-emitting display panel 200. In the direction perpendicular to the first substrate 11, the height of the pad 400 may be greater than or equal to the height of the converging lens 140, so that the pad 400 can prevent the converging lens 140 from being deformed due to pressure when the side of the first substrate 11 on which the lens array 14 is disposed and the non-light-emitting display side of the organic light-emitting display panel 200 are bonded and assembled by using the optical adhesive layer 300. Therefore, the pad 400 plays a role of protecting the lens array 14.

Figure 8:
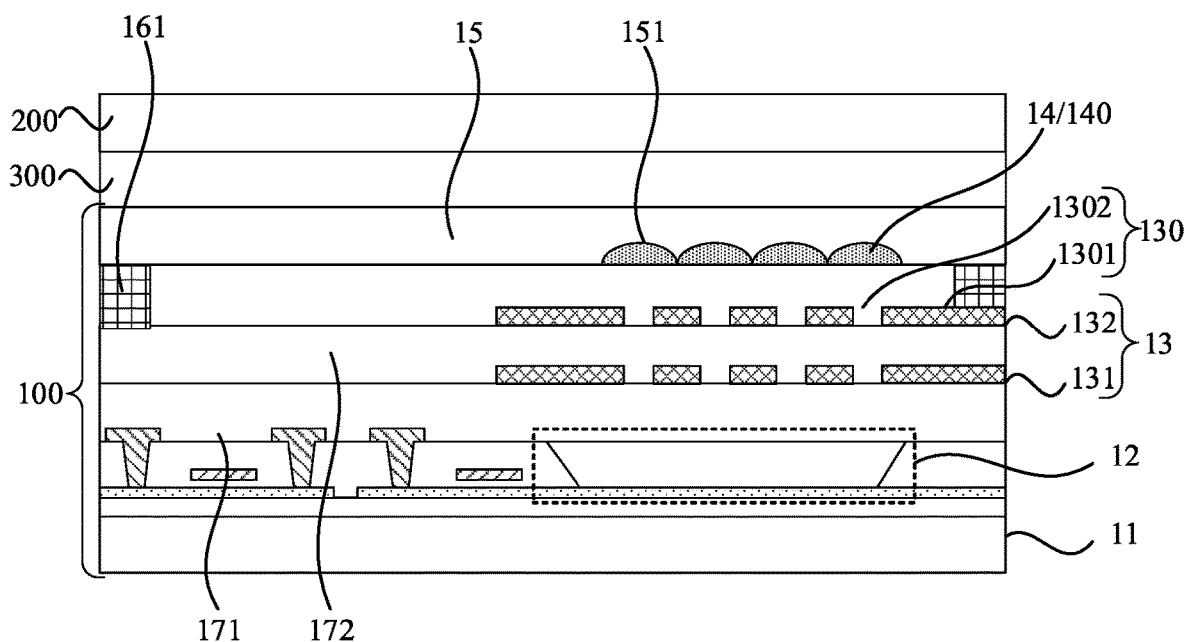
FIG. 8 is a sectional view of another display device according to an embodiment of the present disclosure.

FIG. 8 is a sectional view of another display device according to an embodiment of the present disclosure. Referring to FIG. 8, the display device further includes a second substrate 15 disposed between the light-shielding structure 13 and the organic light-emitting display panel 200. The second substrate 15 includes a plurality of first grooves 151. The converging lenses 140 are disposed in the first grooves 151. In the embodiment of the present disclosure, the second substrate 15 is provided, the plurality of first grooves 151 are formed on the surface of a side of the second substrate 15, and the first grooves 151 are filled with materials forming the converging lenses 140 so as to form the plurality of converging lenses 140. Therefore, the lens array 14 is formed. Since the fingerprint identification unit 12 and the light-shielding structure 13 are formed on the first substrate 11 and the lens array 14 is formed on the second substrate 15, the fingerprint identification unit 12 and the lens array 14 may be formed simultaneously, or the light-shielding structure 13 and the lens array 14 may be formed simultaneously. Thereby, the efficiency of manufacturing the display device is improved.

In an embodiment, referring to FIG. 8, the display device further includes a first encapsulant 161 which is annular in shape. In the direction perpendicular to the first substrate 11, the first encapsulant 161 is disposed between the second substrate 15 and the light-shielding structure 13. In the embodiment of the present disclosure, the second substrate 15 is bonded to the side of the first substrate 11 on which the light-shielding structure 13 is disposed by the first encapsulant 161.

Figure 9:
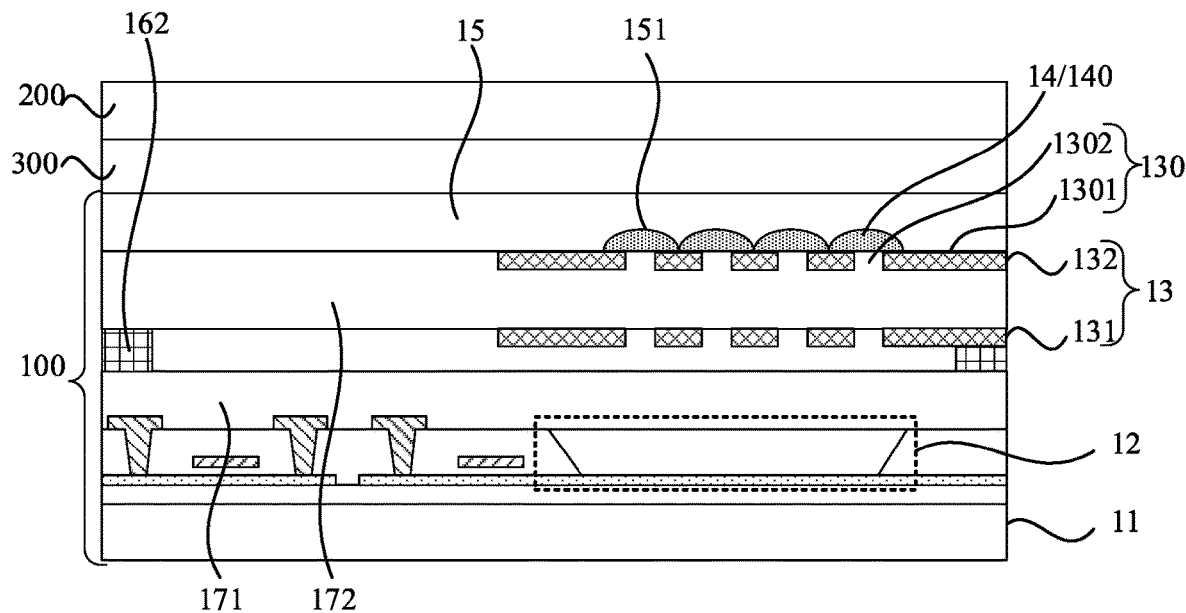
FIG. 9 is a sectional view of another display device according to an embodiment of the present disclosure.

FIG. 9 is a sectional view of another display device according to an embodiment of the present disclosure. Referring to FIG. 9, the display device includes the first substrate 11, the second substrate 15, and a second encapsulant 162 which is annular in shape. In the direction perpendicular to the first substrate 11, the second encapsulant 162 is disposed between the light-shielding structure 13 and the fingerprint identification unit 12. In the embodiment of the present disclosure, the side of the second substrate 15 on which the light-shielding structure 13 is formed is bonded to the side of the fingerprint identification unit 12 on the first substrate 11 by the second encapsulant 162. Since the fingerprint identification unit 12 is formed on the first substrate 11, and the lens array 14 and the light-shielding structure 13 are formed on the second substrate 15, the fingerprint identification unit 12 and the lens array 14 may be formed simultaneously, or the fingerprint identification unit 12 and the light-shielding structure 13 may be formed simultaneously. Thereby, the efficiency of manufacturing the display device is improved.

Exemplarily, referring to FIG. 8 or FIG. 9, the first grooves 151 are formed on the surface of the side of the second substrate 15 facing adjacent to the first substrate 11, and the lens array 14 is disposed between the second substrate 15 and the first substrate 11, so that the second substrate 15 can protect the lens array 14 from pressure and damage when the side of the second substrate 15 facing away from the first substrate 11 is bonded to and assembled with the non-light-emitting display side of the organic light-emitting display panel 200 by the optical adhesive layer 300. Thereby, the second substrate 15 plays a role of protecting the lens array 14. In other implementations, the lens array 14 may also be disposed on the side of the second substrate 15 facing away from the first substrate 11.

Figure 10:
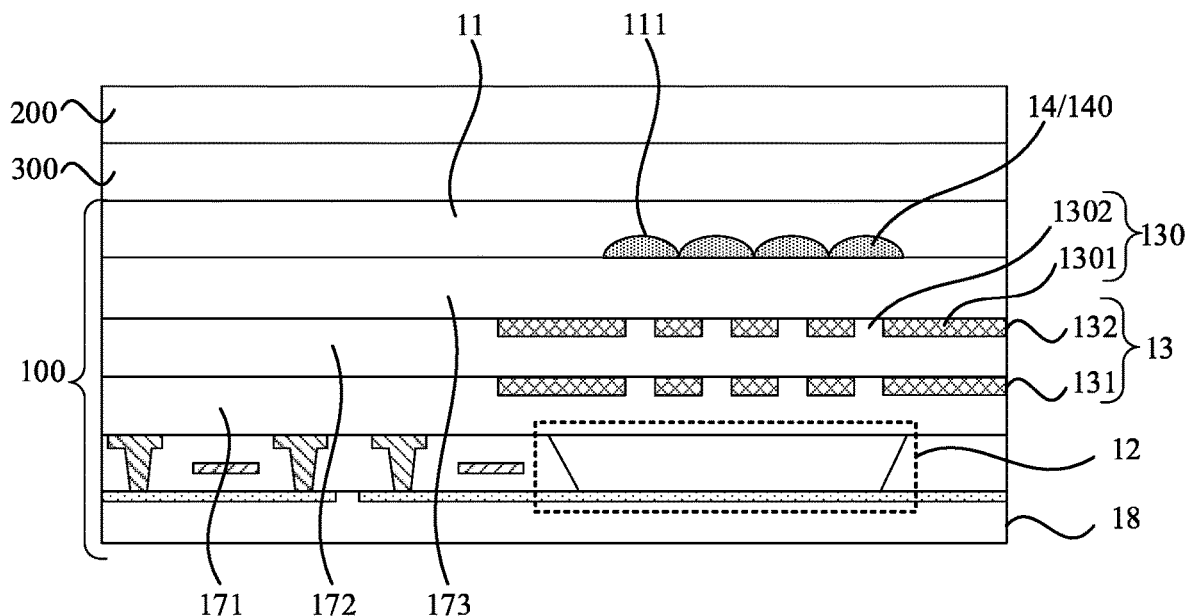
FIG. 10 is a sectional view of another display device according to an embodiment of the present disclosure.

FIG. 10 is a sectional view of another display device according to an embodiment of the present disclosure. Referring to FIG. 10, the light-shielding structure 13 and the fingerprint identification unit 12 are both disposed on the side of the first substrate 11 facing away from the organic light-emitting display panel 200. In the embodiment of the present disclosure, the fingerprint identification unit 12 and the light-shielding structure 13 may be formed on the first substrate 11 and there is no need to provide a base substrate other than the first substrate 11, saving the process and reducing the thickness of the display device.

In an embodiment, referring to FIG. 10, the first substrate 11 includes a plurality of second grooves 111. The converging lenses 140 are disposed in the second grooves 111. In the embodiment of the present disclosure, the plurality of second grooves 111 are formed on the surface of a side of the first substrate 11, and the second grooves 111 are filled with materials forming the converging lenses 140 so as to form the plurality of converging lenses 140. Therefore, the lens array 14 is formed. Since the fingerprint identification unit 12 and the light-shielding structure 13 are also formed on the first substrate 11, there is no need to provide an additional base substrate for the lens array 14, the process is saved, and the thickness of the display device is reduced.

Exemplarily, referring to FIG. 10, a resin material may be used for the converging lens 140 and includes an epoxy resin or a polyacrylic resin. The converging lens 140 may be formed by means of imprint, die rolling printing, or (grayscale) lithography.

Exemplarily, referring to FIG. 10, the second grooves 111 are formed on the surface of the side of the first substrate 11 facing adjacent to the light-shielding structure 13, and the lens array 14 is disposed between the first substrate 11 and the light-shielding structure 13, so that the first substrate 11 can protect the lens array 14 from pressure and damage when the side of the first substrate 11 facing away from the light-shielding 13 is bonded to and assembled with the non-light-emitting display side of the organic light-emitting display panel 200 by the optical adhesive layer 300. Thereby, the first substrate 11 plays a role of protecting the lens array 14.

Figure 11:
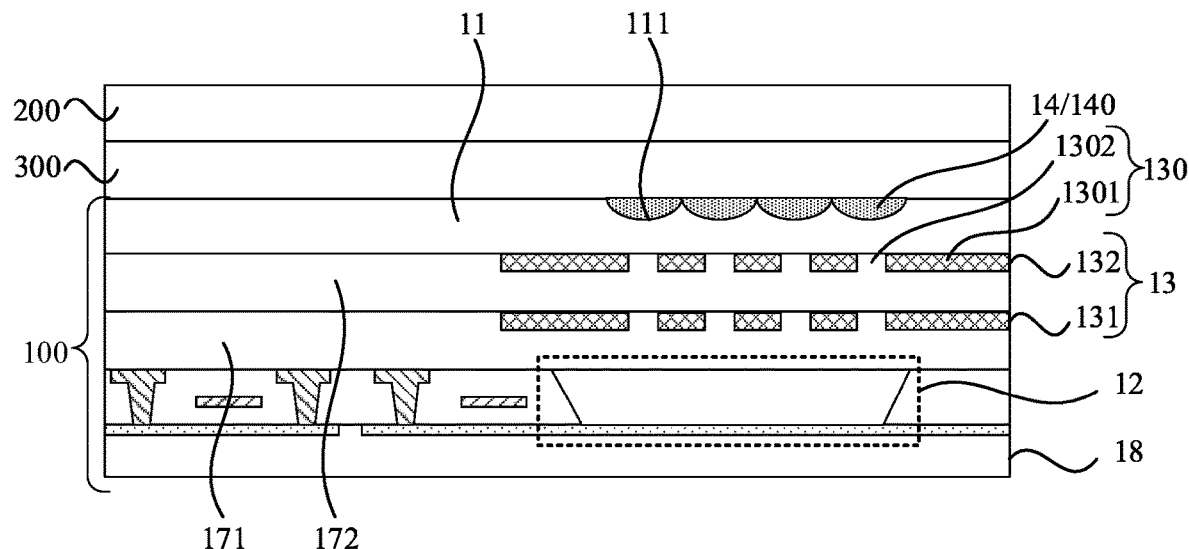
FIG. 11 is a sectional view of another display device according to an embodiment of the present disclosure.

FIG. 11 is a sectional view of another display device according to an embodiment of the present disclosure. Referring to FIG. 11, the second grooves 111 are disposed on the surface of the side of the first substrate 11 facing away from the light-shielding structure 13, and the lens array 14 is disposed on the side of the first substrate 11 facing away from the light-shielding structure 13. The lens array 14 and the light-shielding structure 13 are disposed on opposite sides of the first substrate 11. In the embodiment of the present disclosure, the lens array 14 is disposed on the side of the first substrate 11 facing away from the light-shielding structure 13, and the surface of the side of the first substrate 11 facing away from the lens array 14 is a flat surface, so the light-shielding structure 13 may be directly formed on the surface of the side of the first substrate 11 facing away from the lens array 14, and there is no need to provide a dielectric layer between the first substrate 11 and the light-shielding structure 13 (e.g., the second light-shielding layer 132). Thereby, the process is saved and the thickness of the display device is reduced.

Exemplarily, referring to FIG. 10 or FIG. 11, the display device further includes a protective layer 18 disposed on the side of the fingerprint identification unit 12 facing away from the first substrate 11, and the fingerprint identification unit 12 and the light-shielding structure 13 are both disposed between the first substrate 11 and the protective layer 18 so that the protective layer 18 can protect the fingerprint identification unit 12 and the light-shielding structure 13 from external damage.

Figure 12:
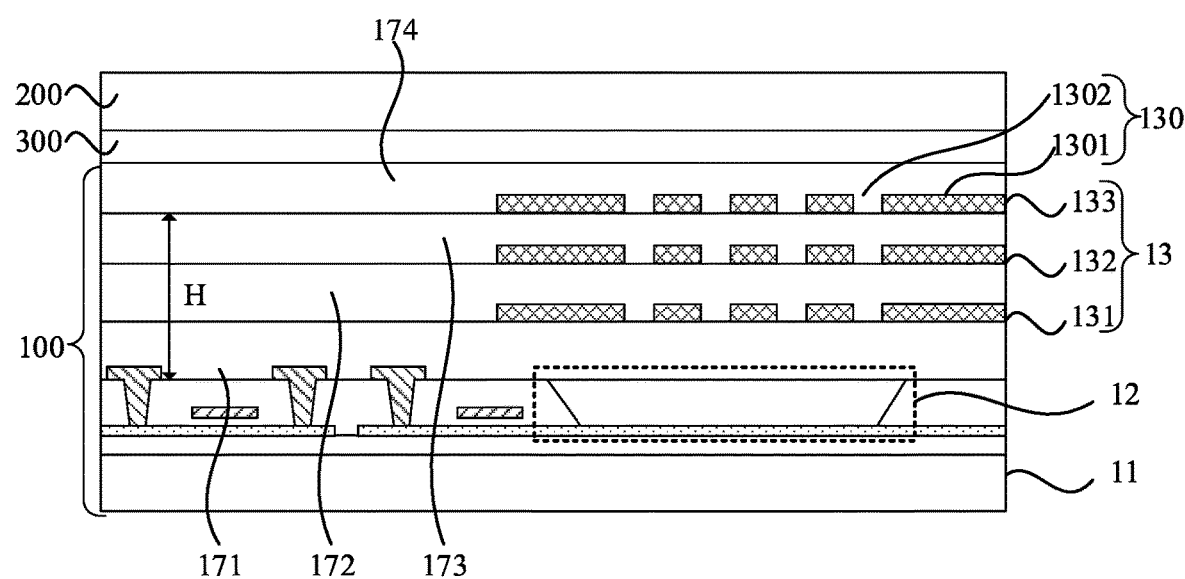
FIG. 12 is a sectional view of another display device according to an embodiment of the present disclosure.

FIG. 12 is a sectional view of another display device according to an embodiment of the present disclosure. Referring to FIG. 12, the light-shielding structure 13 includes at least two light-shielding layers 130; the plurality of light-shielding layers 130 includes a first light-shielding layer 131, a second light-shielding layer 132, and a third light-shielding layer 133; and the second light-shielding layer 132 is disposed between the first light-shielding layer 131 and the third light-shielding layer 133, and the first light-shielding layer 131 is disposed between the second light-shielding layer 132 and the fingerprint identification unit 12. The display device further includes the first dielectric layer 171, the second dielectric layer 172, and the third dielectric layer 173. The first dielectric layer 171 is disposed between the fingerprint identification unit 12 and the first light-shielding layer 131, the second dielectric layer 173 is disposed between the first light-shielding layer 131 and the second light-shielding layer 132, and the third dielectric layer 173 is disposed between the second light-shielding layer 132 and the third light-shielding layer 133. In the direction perpendicular to the first substrate 11, a sum of the thickness of the first dielectric layer 171, the thickness of the second dielectric layer 172, and the thickness of the third dielectric layer 173 is H, and H is greater than or equal to 9 μm. In the embodiment of the present disclosure, the first light-shielding layer 131, the second light-shielding layer 132, and the third light-shielding layer 133 are disposed, and light-transmissive portions 1302 in any two of the first light-shielding layer 131, the second light-shielding layer 132, and the third light-shielding layer 133 overlap in one-to-one correspondence. The fingerprint signal light reflected by the touch body needs to pass through the light-transmissive portion 1302 in the first light-shielding layer 131, the light-transmissive portion 1302 in the second light-shielding layer 132, and the light-transmissive portion 1302 in the third light-shielding layer 133 before being projected onto the fingerprint identification unit 12, thereby further improving the collimation effect of the fingerprint signal light. Further, the farther the third light-shielding layer 133 is away from the fingerprint identification unit 12, the smaller the angle of light passing through the light-shielding structure 13 to be projected to the fingerprint identification unit 12, and the better the collimation effect of the light-shielding structure 13 on the fingerprint signal light. In the embodiment of the present disclosure, the sum of the thickness of the first dielectric layer 171, the thickness of the second dielectric layer 172, and the thickness of the third dielectric layer 173 is greater than or equal to 9 μm, so that the distance between the third-shielding layer 133 and the fingerprint identification unit 12 is greater than or equal to 9 μm to further improve the collimation effect of the fingerprint signal light. In other implementations, the lens array 14 may also be formed on the side of the third dielectric layer 133 facing away from the first substrate 11. In another implementation, the thickness of the display device may also be increased in such manner that at least four light-shielding layers 130 are disposed in order to further improve the collimation effect of the fingerprint signal light.

Exemplarily, referring to FIG. 12, the display device may further includes a fourth dielectric layer 174 disposed on the side of the third light-shielding layer 133 facing away from the first substrate 11, and the surface of the side of the fourth dielectric layer 174 facing away from the first substrate 11 is a flat surface, which is advantageous to bonding and assembling the side of the fourth dielectric layer 174 facing away from the first substrate 11 and the non-light-emitting display side of the organic light-emitting display panel 200 by the optical adhesive layer 300.

Figure 13:
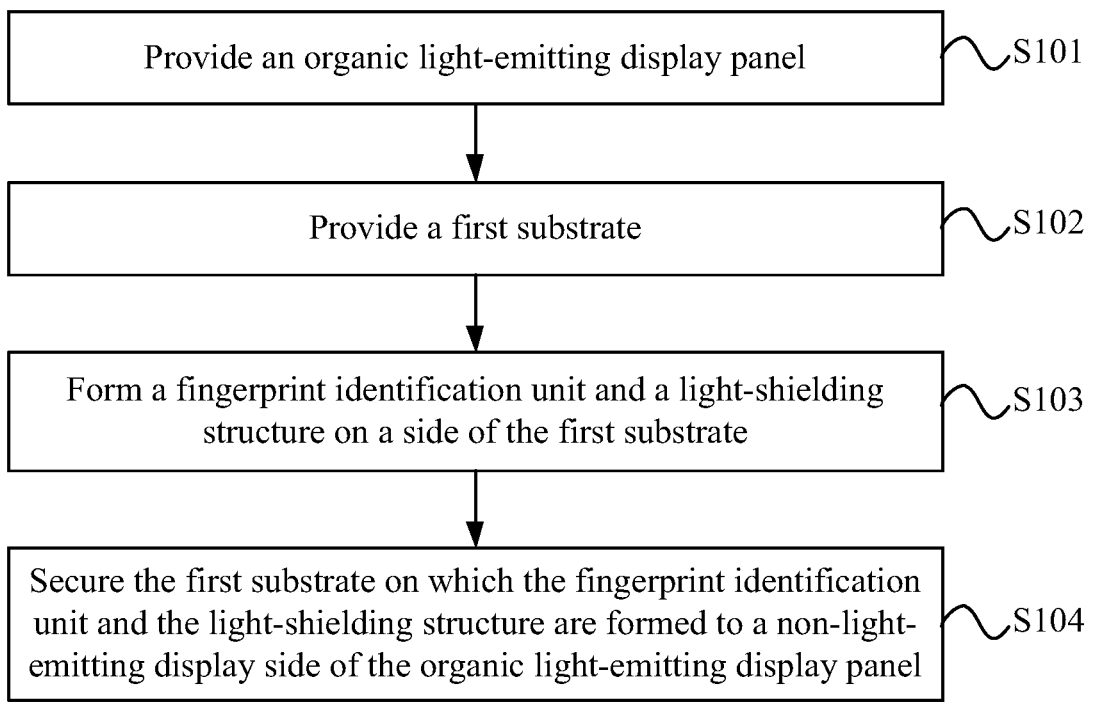
FIG. 13 is a flowchart illustrating a manufacturing method of a display device according to an embodiment of the present disclosure.

FIG. 13 is a flowchart illustrating a manufacturing method of a display device according to an embodiment of the present disclosure. Referring to FIGS. 1 to 12 and FIG. 13, the manufacturing method of a display device includes steps described below.

In step S101, an organic light-emitting display panel 200 is provided.

In step S102, a first substrate 11 is provided.

In step S103, a fingerprint identification unit 12 and a light-shielding structure 13 are formed on a side of the first substrate 11.

The light-shielding structure 13 includes at least two light-shielding layers 130. The light-shielding layer 130 includes a light-transmissive portion 1302 and a light-shielding portion 1301. The light-transmissive portion 1302 is at least partially surrounded by the light-shielding portion 1301. In a direction perpendicular to the first substrate 11, positions of light-transmissive portions 1302 in one light-shielding layer 130 are in one-to-one correspondence with positions of light-transmissive portions 1302 in another one light-shielding layer 130.

In step S104, the first substrate 11 on which the fingerprint identification unit 12 and the light-shielding structure 13 are formed is secured to a non-light-emitting display side of the organic light-emitting display panel 200.

In this step, in an implementation, the side of the first substrate 11 on which the fingerprint identification unit 12 and the light-shielding structure 13 are formed may be bonded toward the non-light-emitting display side of the organic light-emitting display panel 200; in another implementation, the side of the first substrate 11 facing away from the fingerprint identification unit 12 and the light-shielding structure 13 may be bonded toward the non-light-emitting display side of the organic light-emitting display panel 200.

The manufacturing method provided in the embodiment of the present disclosure is used for forming the display device in the preceding embodiment. In the manufacturing method, the fingerprint identification unit 12 and the light-shielding structure 13 are disposed on the same side of the first substrate 11 and are integrated together, so that the collimating film is not required to be purchased separately, the cost of manufacturing the display device is reduced, and the process flow of manufacturing the display device is simplified. It is to be noted that since the organic light-emitting display panel 200 is independently manufactured and formed, and the fingerprint identification unit 12 and the light-shielding structure 13 are finally integrated on the non-light-emitting display side of the organic light-emitting display panel 200 in a manner of external hanging, the step S101 of providing the organic light-emitting display panel 200 may be performed at any step before the step S104 in the manufacturing method of the display device.

Figure 14:
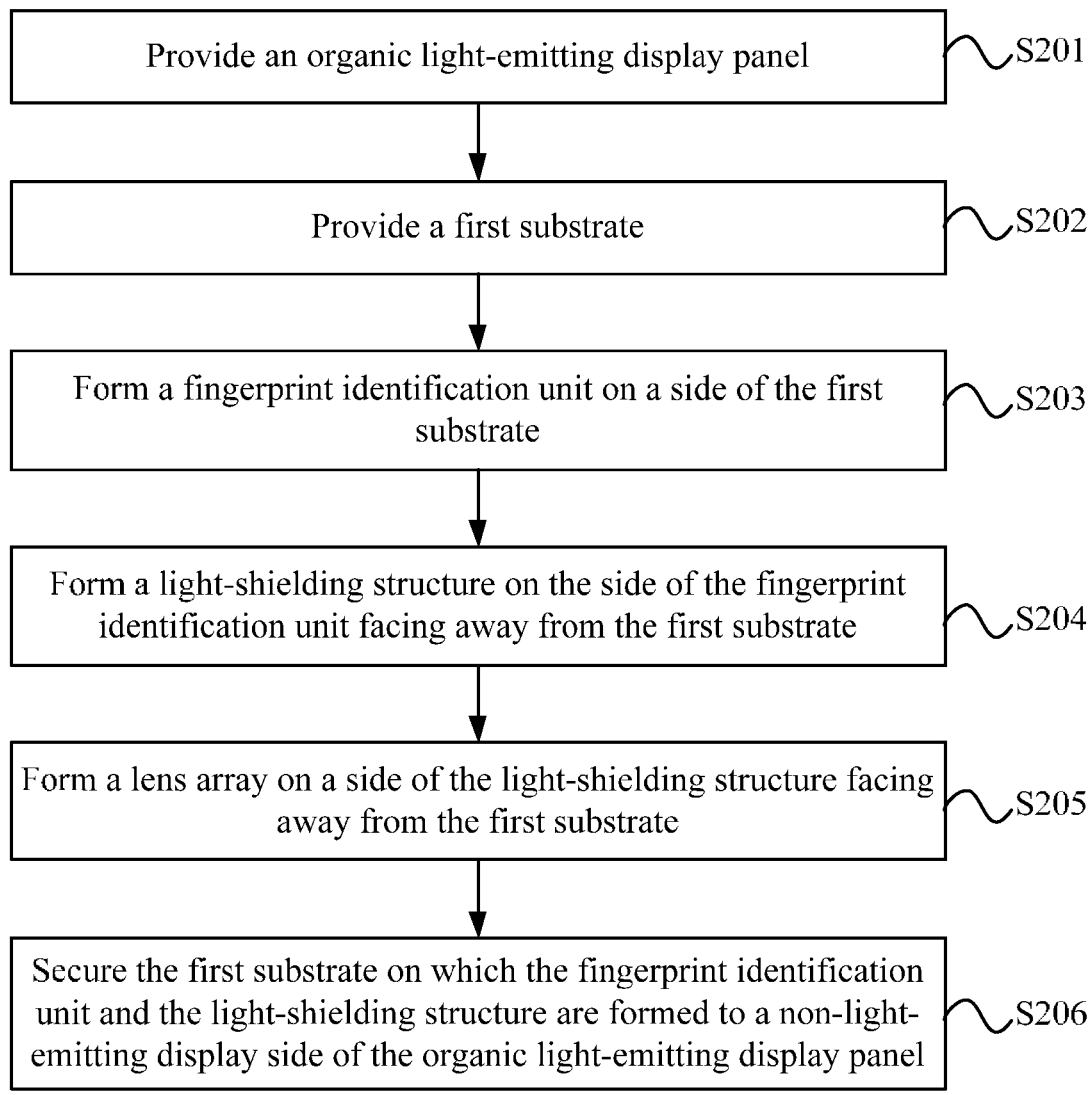
FIG. 14 is a flowchart illustrating another manufacturing method of a display device according to an embodiment of the present disclosure.
Figure 15:
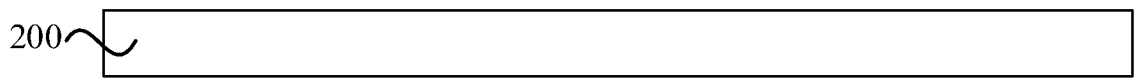
FIG. 15 to FIG. 19 are schematic diagrams illustrating a manufacturing process of a display device according to an embodiment of the present disclosure.
Figure 16:

FIG. 14 is a flowchart illustrating another manufacturing method of a display device according to an embodiment of the present disclosure. FIG. 15 to FIG. 19 are schematic diagrams illustrating a manufacturing process of a display device according to an embodiment of the present disclosure. Referring to FIG. 4, FIG. 14 and FIG. 15 to FIG. 19, the manufacturing method of a display device includes steps described below.

In step S201, an organic light-emitting display panel 200 is provided.

In step S202, a first substrate 11 is provided.

In step S203, a fingerprint identification unit 12 is formed on a side of the first substrate 11.

Figure 17:
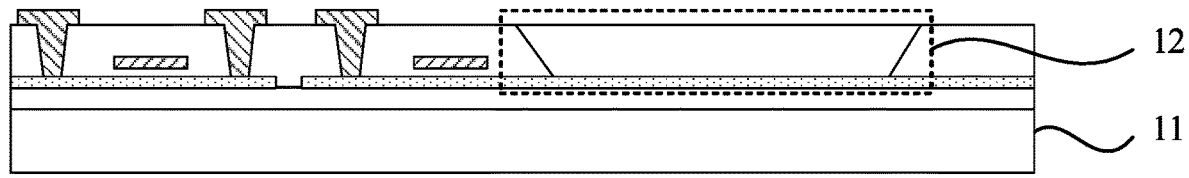

Exemplarily, referring to FIG. 17, a buffer layer is formed on a side of the first substrate 11, a patterned polycrystalline silicon layer is formed on the side of the buffer layer facing away from the first substrate 11, a gate is formed on the side of the polycrystalline silicon layer facing away from the first substrate 11, a source and drain of a thin-film transistor are formed on the side of the gate facing away from the first substrate 11, a monocrystalline silicon layer is formed on the side of the polycrystalline silicon layer facing away from the first substrate 11 and is formed on the polycrystalline silicon layer, and the polycrystalline silicon layer and the monocrystalline silicon layer formed on the polycrystalline silicon layer constitute a PIN-type photodiode, that is, the fingerprint identification unit 12.

In step S204, a light-shielding structure 13 is formed on the side of the fingerprint identification unit 12 facing away from the first substrate 11.

Figure 18:
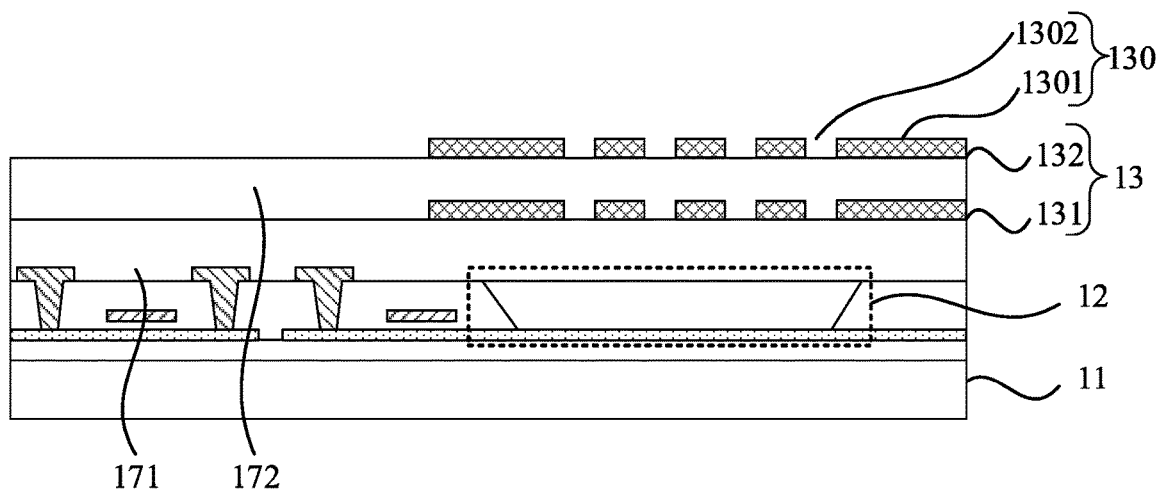

Exemplarily, referring to FIG. 18, a first dielectric layer 171 is formed on the side of the fingerprint identification unit 12 facing away from the first substrate 11, a first light-shielding layer 131 is formed on the side of the first dielectric layer 171 facing away from the first substrate 11, and a second light-shielding layer 132 is formed on the side of the first light-shielding layer 131 facing away from the first substrate 11. The light-shielding structure 13 includes the first light-shielding layer 131 and the second light-shielding layer 132.

In step S205, a lens array 14 is formed on a side of the light-shielding structure 13 facing away from the first substrate 11.

Figure 19:
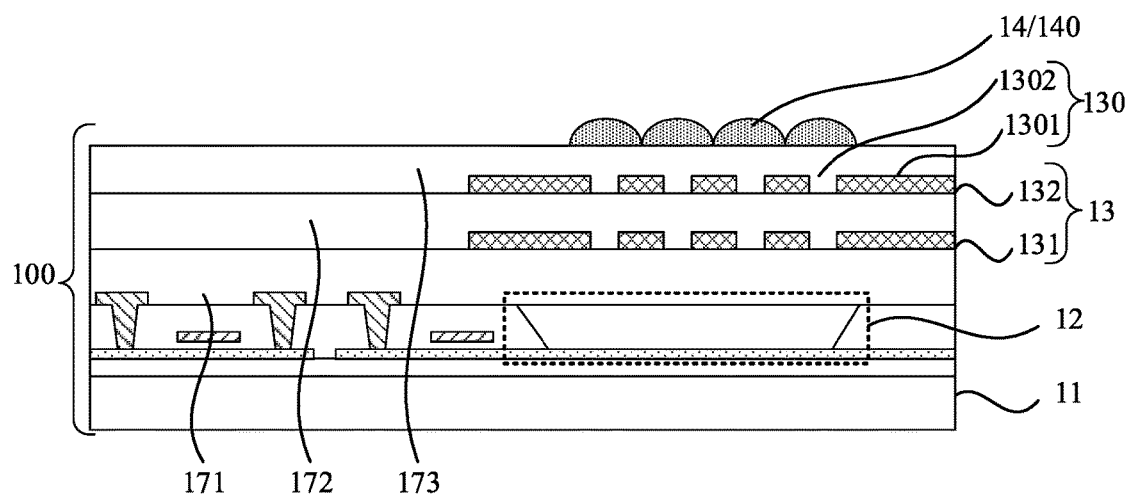

Exemplarily, referring to FIG. 19, a third dielectric layer 173 is formed on the side of the second light-shielding layer 132 facing away from the first substrate 11, and the lens array 14 is formed on the side of the third dielectric layer 173 facing away from the first substrate 11. The lens array 14 includes a plurality of converging lenses 140, and in the direction perpendicular to the first substrate 11, the converging lens 140 covers at least one light-transmissive portion 1302 in a same light-shielding layer 130. Exemplarily, the lens array 14 may be formed by a dry or wet etching process, and in other implementations, the lens array 14 may also be formed by an imprint method.

In step S206, the first substrate 11 on which the fingerprint identification unit 12 and the light-shielding structure 13 are formed is secured to a non-light-emitting display side of the organic light-emitting display panel 200.

Exemplarily, referring to FIG. 4 and FIG. 19, a pad 400 is formed on the side of the third dielectric layer 173 facing away from the first substrate 11, an optical adhesive layer 300 is coated on the side of the first substrate 11 on which the fingerprint identification unit 12 and the light-shielding structure 13 are formed or an optical adhesive layer 300 is coated on the non-light-emitting display side of the organic light-emitting display panel 200, and the side of the first substrate 11 on which the lens array 14 is disposed and the non-light-emitting display side of the organic light-emitting display panel 200 are bonded and assembled by the optical adhesive layer 300.

Figure 20:
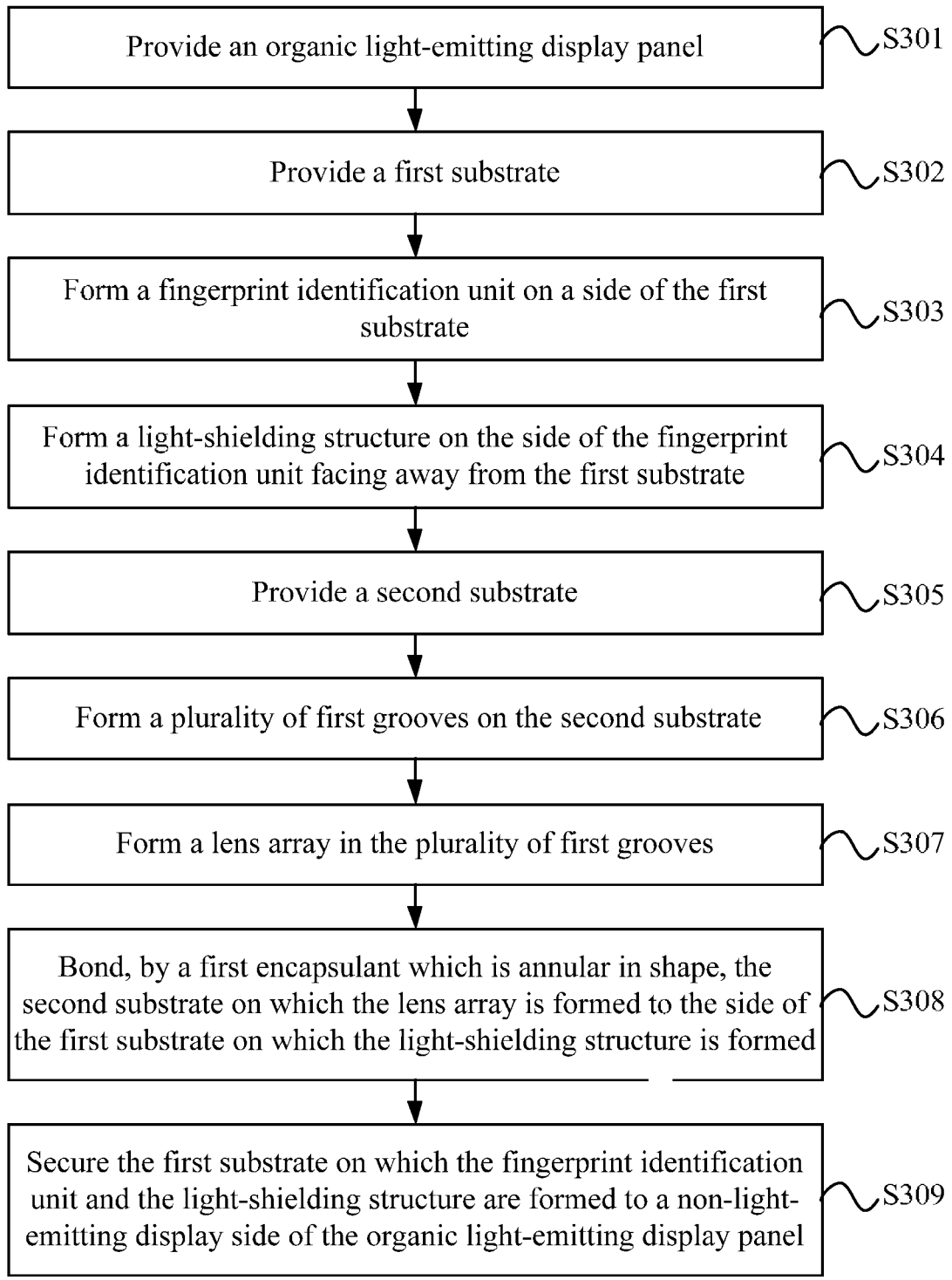
FIG. 20 is a flowchart illustrating another manufacturing method of a display device according to an embodiment of the present disclosure.
Figure 21:
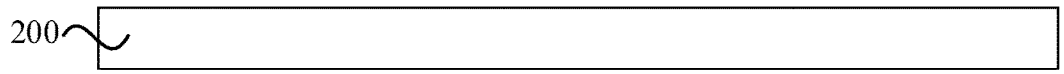
FIG. 21 to FIG. 28 are schematic diagrams illustrating another manufacturing process of a display device according to an embodiment of the present disclosure.
Figure 22:
Figure 23:
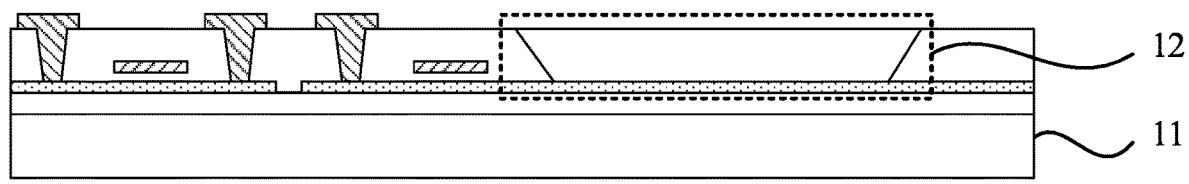
Figure 24:
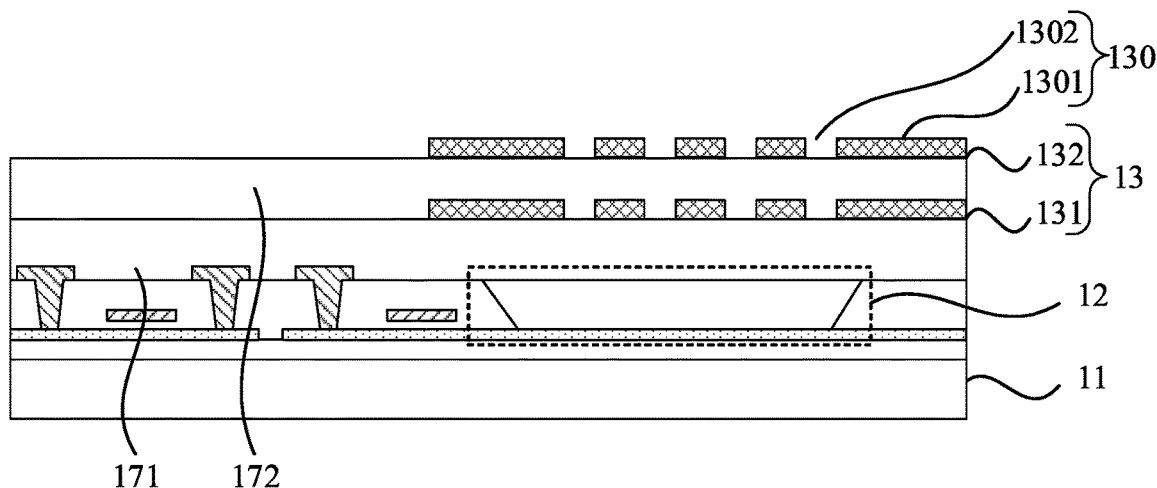
Figure 25:
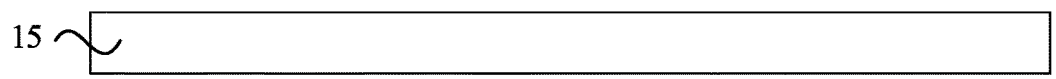
Figure 26:
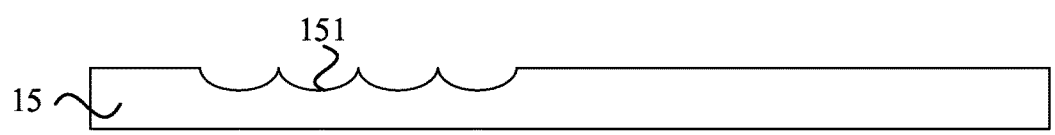

FIG. 20 is a flowchart illustrating another manufacturing method of a display device according to an embodiment of the present disclosure. FIG. 21 to FIG. 28 are schematic diagrams illustrating another manufacturing process of a display device according to an embodiment of the present disclosure. Referring to FIG. 8, FIG. 20 and FIG. 21 to FIG. 28, the manufacturing method of a display device includes steps described below.

In step S301, an organic light-emitting display panel 200 is provided.

In step S302, a first substrate 11 is provided.

In step S303, a fingerprint identification unit 12 is formed on a side of the first substrate 11.

In step S304, a light-shielding structure 13 is formed on the side of the fingerprint identification unit 12 facing away from the first substrate 11.

In step S305, a second substrate 15 is provided.

In step S306, a plurality of first grooves 151 are formed on the second substrate 15.

In step S307, a lens array 14 is formed in the plurality of first grooves 151.

Figure 27:
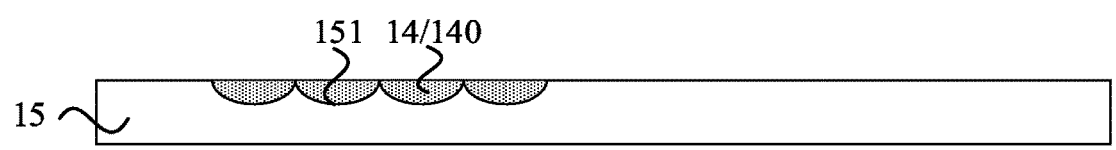

Exemplarily, referring to FIG. 27, the first grooves 151 are filled with materials forming the converging lenses 140 so as to form a plurality of converging lenses 140. Therefore, the lens array 14 is formed.

In step S308, the second substrate 15 on which the lens array 14 is formed is bonded to the side of the first substrate 11 on which the light-shielding structure 13 is formed by a first encapsulant 161 which is annular in shape.

Figure 28:
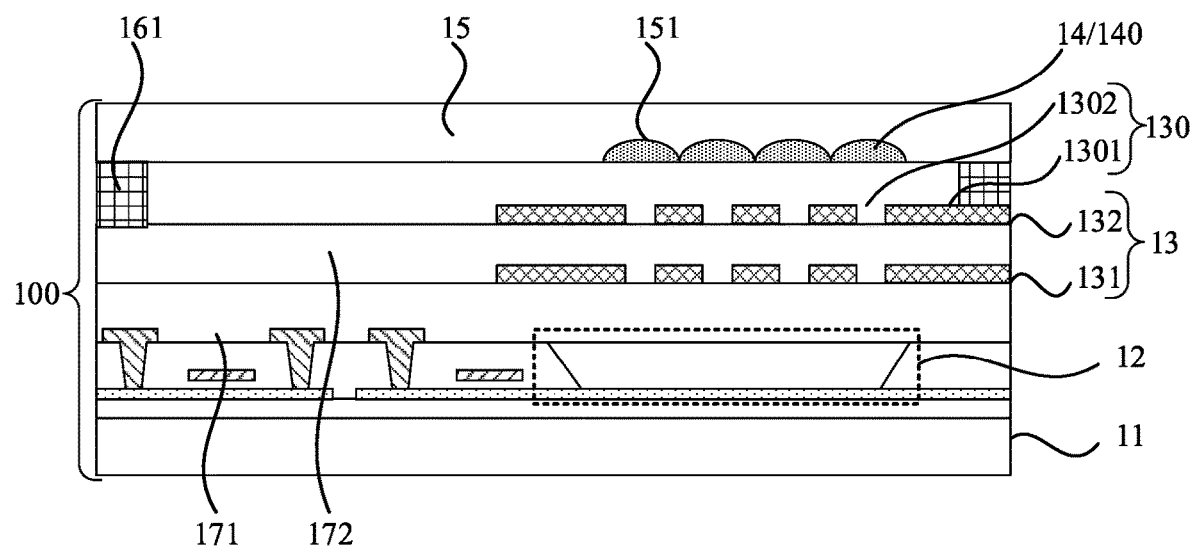

Exemplarily, referring to FIG. 28, one portion of the first encapsulant 161 is in contact with a second dielectric layer 172, and the other portion of the first encapsulant 161 is in contact with the light-shielding structure 13. In other implementations, all of the first encapsulant 161 may be in contact with the second dielectric layer 172, or all of the first encapsulant 161 may be in contact with the light-shielding structure 13.

Exemplarily, in an implementation, the first encapsulant 161 may be formed on the first substrate 11 and is used to bond the first substrate 11 and the second substrate 15 together. In another implementation, the first encapsulant 161 may be formed on the second substrate 15 and is used to bond the first substrate 11 and the second substrate 15 together.

Exemplarily, referring to FIG. 28, the side of the second substrate 15 on which the lens array 14 is formed is bonded to the side of the first substrate 11 on which the light-shielding structure 13 is formed by the first encapsulant 161 which is annular in shape. In other implementations, the side of the second substrate 15 facing away from the lens array 14 and the side of the first substrate 11 on which the light-shielding structure 13 is formed may also be bonded together by the first encapsulant 161 which is annular in shape.

In step S309, the first substrate 11 on which the fingerprint identification unit 12 and the light-shielding structure 13 are formed is secured to a non-light-emitting display side of the organic light-emitting display panel 200.

Exemplarily, referring to FIG. 8, the second substrate 15 is bonded and secured to the organic light-emitting display panel 200 by the optical adhesive layer 300. The first substrate 11 and the second substrate 15 have been bonded and assembled in step S308, so the first substrate 11 is secured to the non-light-emitting display side of the organic light-emitting display panel 200 after the second substrate 15 is bonded and secured to the organic light-emitting display panel 200 by the optical adhesive layer 300.

It is to be noted that the first substrate 11 and the second substrate 12 are two independent base substrates. The step of providing the first substrate 11 and forming a structure on the first substrate 11 does not interfere with the step of providing the second substrate 15 and forming a structure on the second substrate 15. In chronological order, these two steps may be performed sequentially or simultaneously.

Figure 29:
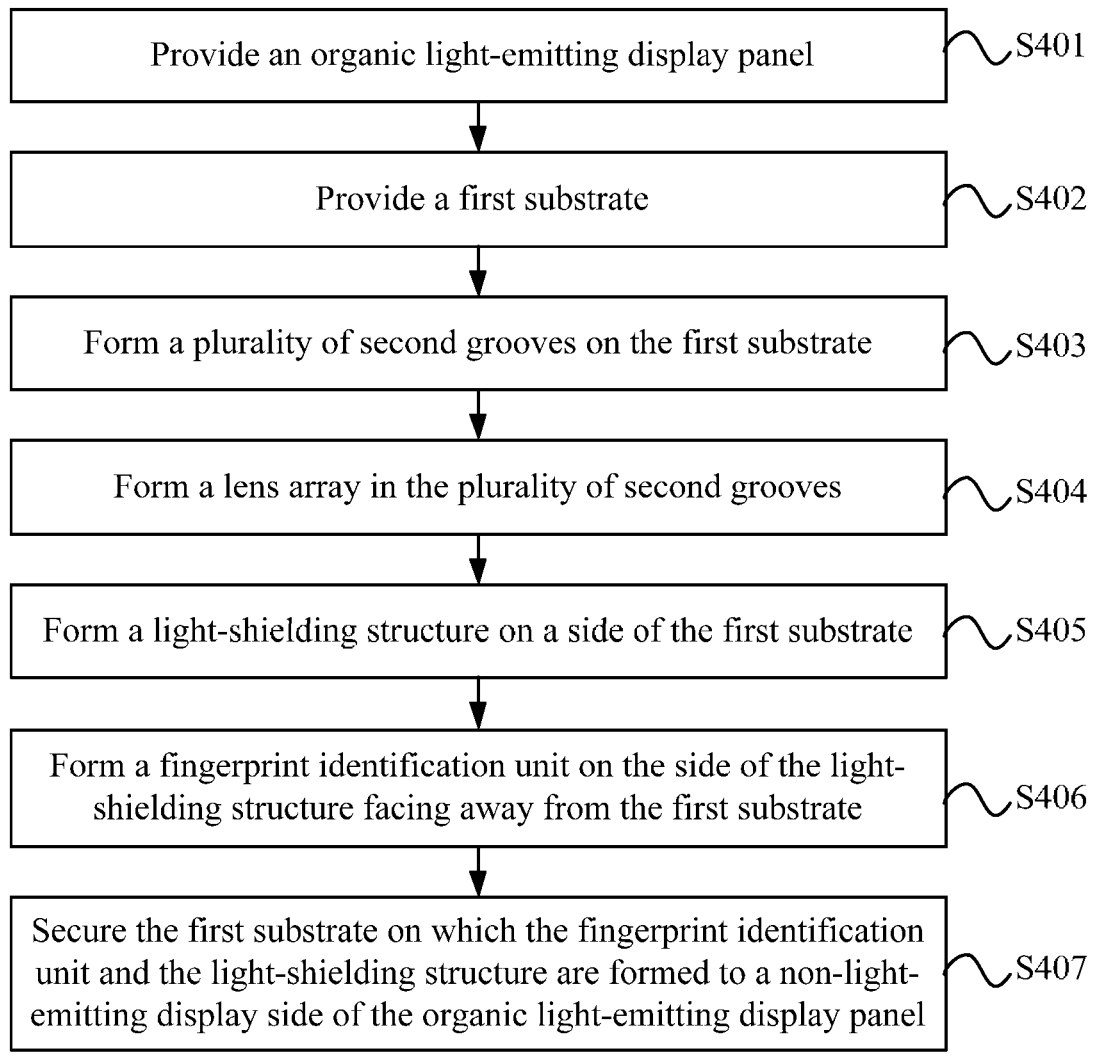
FIG. 29 is a flowchart illustrating another manufacturing method of a display device according to an embodiment of the present disclosure.
Figure 30:
FIG. 30 to FIG. 35 are schematic diagrams illustrating another manufacturing process of a display device according to an embodiment of the present disclosure.
Figure 31:
Figure 32:
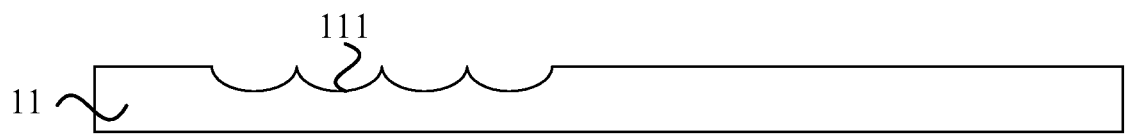

FIG. 29 is a flowchart illustrating another manufacturing method of a display device according to an embodiment of the present disclosure. FIG. 30 to FIG. 35 are schematic diagrams illustrating another manufacturing process of a display device according to an embodiment of the present disclosure. Referring to FIG. 10, FIG. 29 and FIG. 30 to FIG. 35, the manufacturing method of a display device includes steps described below.

In step S401, an organic light-emitting display panel 200 is provided.

In step S402, a first substrate 11 is provided.

In step S403, a plurality of second grooves 111 are formed on the first substrate 11.

In step S404, a lens array 14 is formed in the plurality of second grooves 111.

Figure 33:
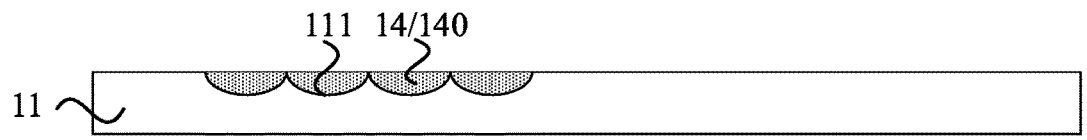

Exemplarily, referring to FIG. 33, the second grooves 111 are filled with materials forming the converging lenses 140 so as to form a plurality of converging lenses 140. Therefore, the lens array 14 is formed.

In step S405, a light-shielding structure 13 is formed on a side of the first substrate 11.

Figure 34:
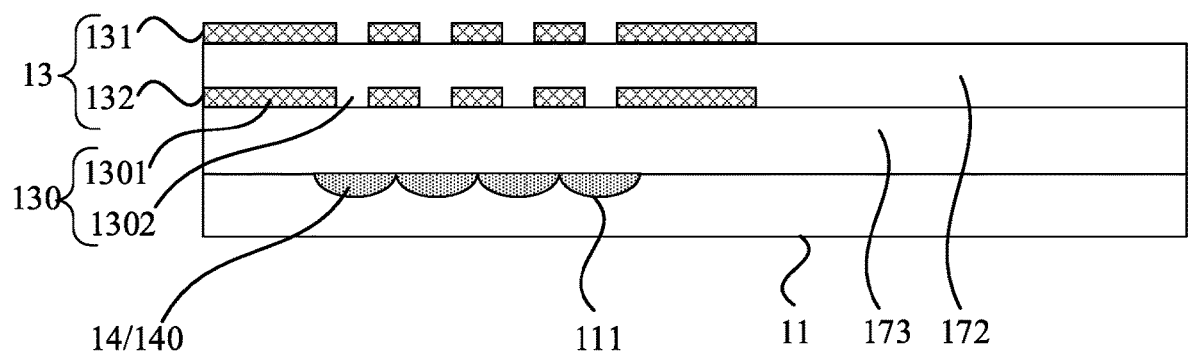

Exemplarily, referring to FIG. 34, the first substrate 11 is used as the base substrate, a third dielectric layer 173 is formed on a side of the first substrate 11, a second light-shielding layer 132 is formed on the side of the third dielectric layer 173 facing away from the first substrate 11, a second dielectric layer 172 is formed on the side of the second light-shielding layer 132 facing away from the first substrate 11, and a first light-shielding layer 131 is formed on the side of the second dielectric layer 172 facing away from the first substrate 11.

The light-shielding structure 13 includes the first light-shielding layer 131 and the second light-shielding layer 132. A light-shielding layer 130 in the light-shielding structure 13 includes a light-transmissive portion 1302 and a light-shielding portion 1301. The light-transmissive portion 1302 is at least partially surrounded by the light-shielding portion 1301. In a direction perpendicular to the first substrate 11, positions of light-transmissive portions 1302 in one light-shielding layer 130 are in one-to-one correspondence with positions of light-transmissive portions 1302 in another one light-shielding layer 130. The lens array 14 includes a plurality of converging lenses 140, and in the direction perpendicular to the first substrate 11, the converging lens 140 covers at least one light-transmissive portion 1302 in a same light-shielding layer 130.

Exemplarily, referring to FIG. 34, the light-shielding structure 13 is formed on the side of the first substrate 11 on which the lens array 14 is disposed. In other implementations, the light-shielding structure 13 may also be formed on the side of the first substrate 11 facing away from the lens array 14.

In step S406, a fingerprint identification unit 12 is formed on the side of the light-shielding structure 13 facing away from the first substrate 11.

Figure 35:
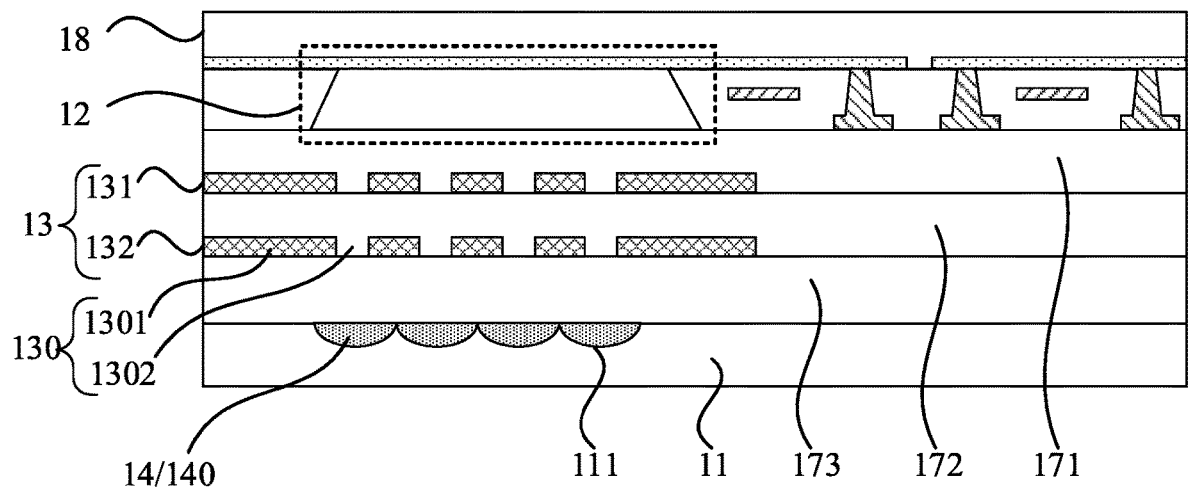

Exemplarily, referring to FIG. 35, a first dielectric layer 171 is formed on the side of the first light-shielding layer 131 facing away from the first substrate 11, and the fingerprint identification unit 12 is formed on the side of the first dielectric layer 171 facing away from the first substrate 11.

Exemplarily, referring to FIG. 35, a protective layer 18 may also be formed on the side of the fingerprint identification unit 12 facing away from the first substrate 11 after the fingerprint identification unit 12 is formed.

In step S407, the first substrate 11 on which the fingerprint identification unit 12 and the light-shielding structure 13 are formed is secured to a non-light-emitting display side of the organic light-emitting display panel 200.

Exemplarily, referring to FIG. 10, the side of the first substrate 11 facing away from the light-shielding structure 13 is bonded and secured to the non-light-emitting display side of the organic light-emitting display panel 200 by the optical adhesive layer 300.

Figure 36:
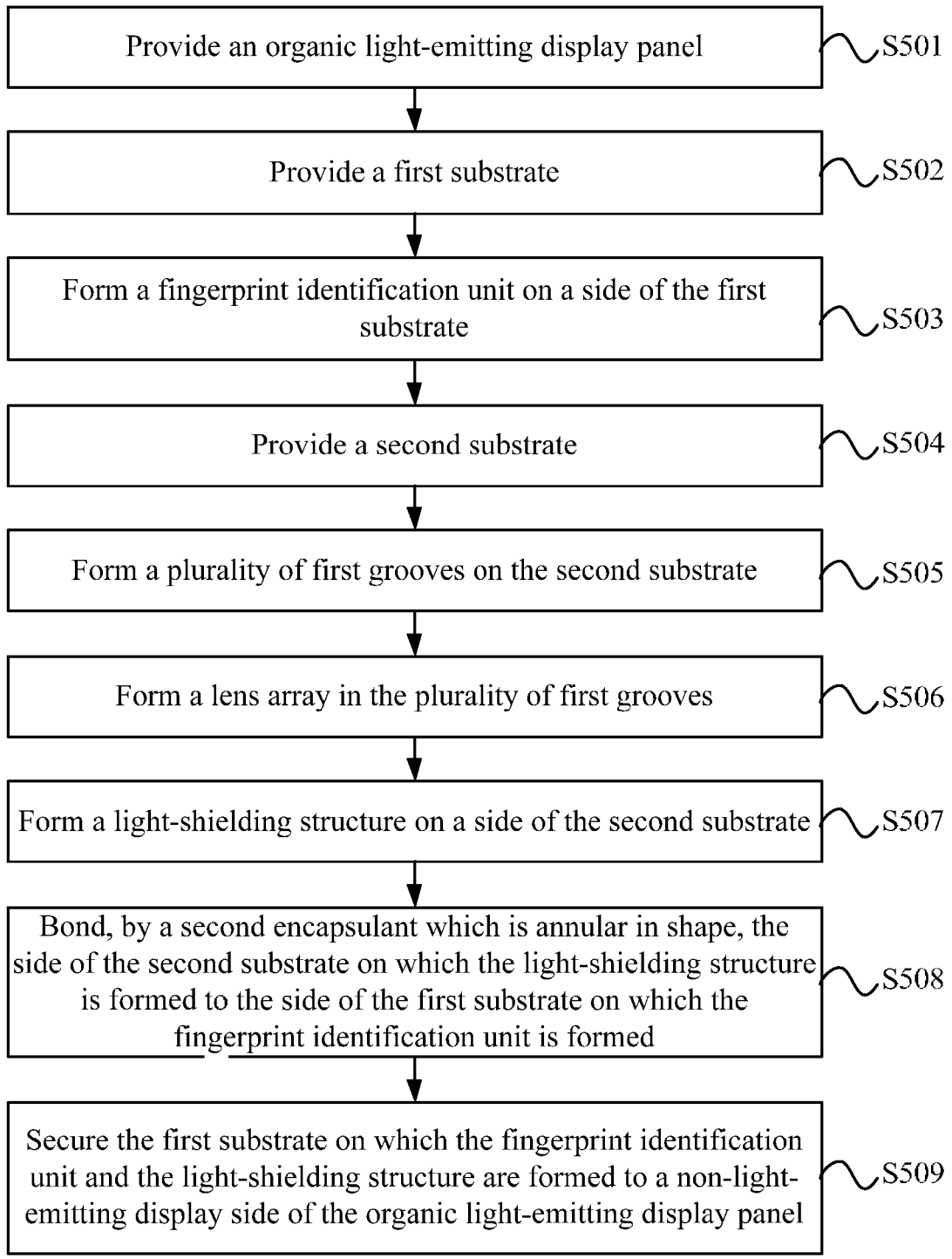
FIG. 36 is a flowchart illustrating another manufacturing method of a display device according to an embodiment of the present disclosure.
Figure 37:
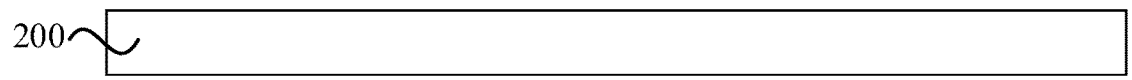
FIG. 37 to FIG. 44 are schematic diagrams illustrating another manufacturing process of a display device according to an embodiment of the present disclosure.
Figure 38:
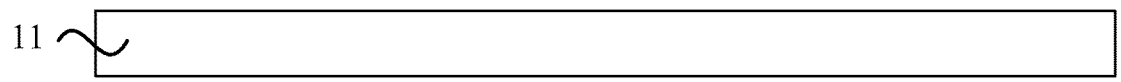

FIG. 36 is a flowchart illustrating another manufacturing method of a display device according to an embodiment of the present disclosure. FIG. 37 to FIG. 44 are schematic diagrams illustrating another manufacturing process of a display device according to an embodiment of the present disclosure. Referring to FIG. 9, FIG. 36 and FIG. 37 to FIG. 44, the manufacturing method of a display device includes steps described below.

In step S501, an organic light-emitting display panel 200 is provided.

In step S502, a first substrate 11 is provided.

In step S503, a fingerprint identification unit 12 is formed on a side of the first substrate 11.

Figure 39:
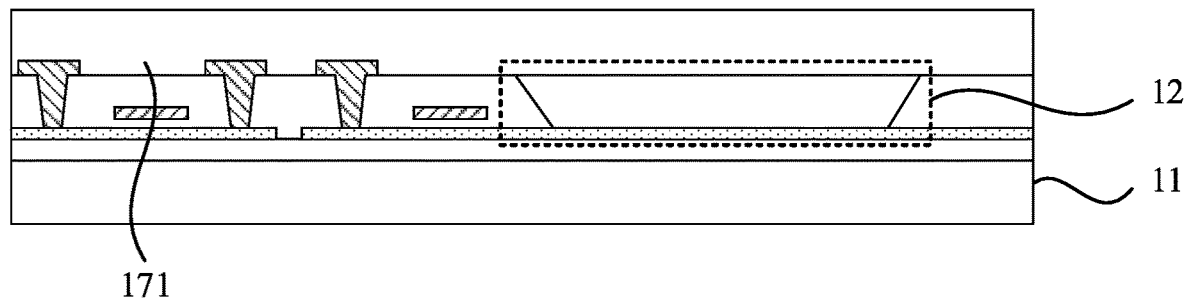
Figure 40:
Figure 41:
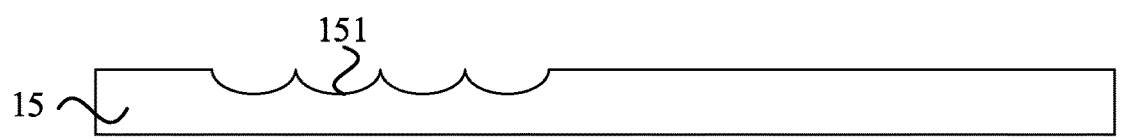
Figure 42:
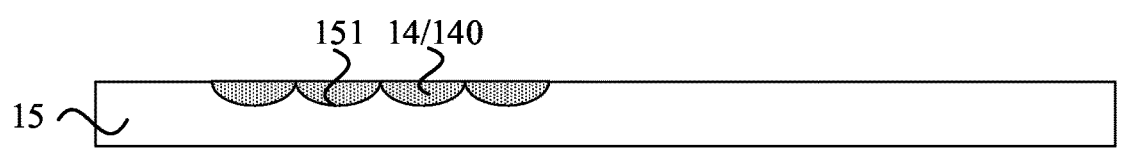

Exemplarily, referring to FIG. 39, a first dielectric layer 171 is formed on the side of the fingerprint identification unit 12 facing away from the first substrate 11.

In step S504, a second substrate 15 is provided.

In step S505, a plurality of first grooves 151 are formed on the second substrate 15.

In step S506, a lens array 14 is formed in the plurality of first grooves 151.

In step S507, a light-shielding structure 13 is formed on a side of the second substrate 15.

Figure 43:
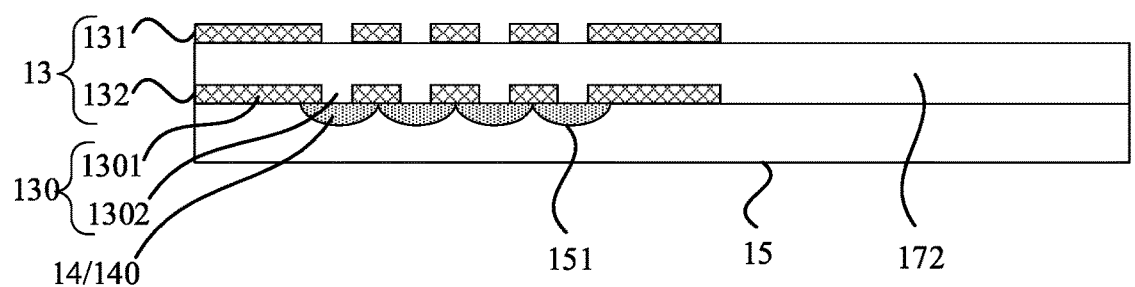

Exemplarily, referring to FIG. 43, a second light-shielding layer 132 is formed on a side of the second substrate 15, a second dielectric layer 172 is formed on the side of the second light-shielding layer 132 facing away from the second substrate 15, and a first light-shielding layer 131 is formed on the side of the second dielectric layer 172 facing away from the second substrate 15.

The light-shielding structure 13 includes the first light-shielding layer 131 and the second light-shielding layer 132. A light-shielding layer 130 in the light-shielding structure 13 includes a light-transmissive portion 1302 and a light-shielding portion 1301. The light-transmissive portion 1302 is at least partially surrounded by the light-shielding portion 1301. In a direction perpendicular to the second substrate 15, positions of light-transmissive portions 1302 in one light-shielding layer 130 are in one-to-one correspondence with positions of light-transmissive portions 1302 in another one light-shielding layer 130. The lens array 14 includes a plurality of converging lenses 140, and in the direction perpendicular to the second substrate 15, the converging lens 140 covers at least one light-transmissive portion 1302 in a same light-shielding layer 130.

Exemplarily, referring to FIG. 43, the light-shielding structure 13 is formed on the side of the second substrate 15 on which the lens array 14 is disposed. In other implementations, the light-shielding structure 13 may also be formed on the side of the second substrate 15 facing away from the lens array 14.

In step S508, the side of the second substrate 15 on which the light-shielding structure 13 is formed is bonded to the side of the first substrate 11 on which the fingerprint identification unit 12 is formed by a second encapsulant 162 which is annular in shape.

Figure 44:
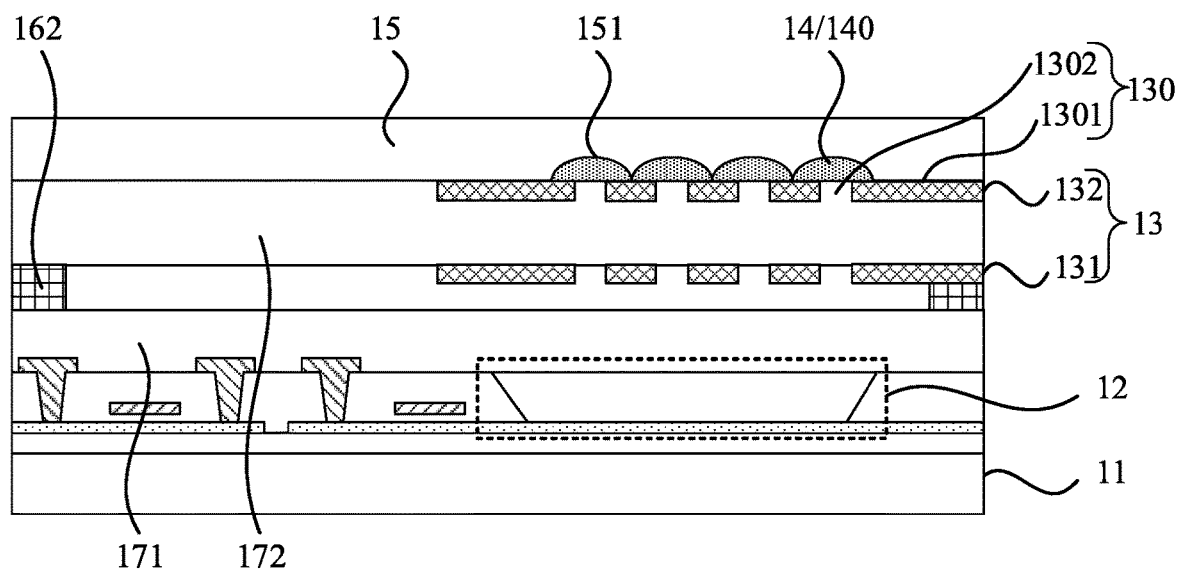

Exemplarily, referring to FIG. 44, a portion of the second encapsulant 162 is in contact with the second dielectric layer 172, and the other portion of the second encapsulant 162 is in contact with the light-shielding structure 13. In other implementations, all of the second encapsulant 162 may be in contact with the second dielectric layer 172, or all of the second encapsulant 162 may be in contact with the light-shielding structure 13.

Exemplarily, in an implementation, the second encapsulant 162 may be formed on the first substrate 11 and is used to bond the first substrate 11 and the second substrate 15 together. In another implementation, the second encapsulant 162 may be formed on the second substrate 15 and is used to bond the first substrate 11 and the second substrate 15 together.

In step S509, the first substrate 11 on which the fingerprint identification unit 12 and the light-shielding structure 13 are formed is secured to a non-light-emitting display side of the organic light-emitting display panel 200.

Exemplarily, referring to FIG. 9, the second substrate 15 is bonded and secured to the organic light-emitting display panel 200 by the optical adhesive layer 300. The first substrate 11 and the second substrate 15 have been bonded and assembled in step S508, so the first substrate 11 is secured to the non-light-emitting display side of the organic light-emitting display panel 200 after the second substrate 15 is bonded and secured to the organic light-emitting display panel 200 by the optical adhesive layer 300.

It is to be noted that the preceding are only embodiments of the present disclosure and the technical principles used therein. It will be understood by those skilled in the art that the present disclosure is not limited to the embodiments described herein. For those skilled in the art, various apparent modifications, adaptations, combinations and substitutions can be made without departing from the scope of the present disclosure. Therefore, while the present disclosure has been described in detail via the preceding embodiments, the present disclosure is not limited to the preceding embodiments and may include more equivalent embodiments without departing from the concept of the present disclosure. The scope of the present disclosure is determined by the scope of the appended claims.

What is claimed is:

1. A display device, comprising: an organic light-emitting display panel and a fingerprint identification assembly disposed on a non-light-emitting display side of the organic light-emitting display panel;
    wherein the fingerprint identification assembly comprises a first substrate, a fingerprint identification unit and a light-shielding structure, and the fingerprint identification unit and the light-shielding structure are disposed on a same side of the first substrate;
    wherein the light-shielding structure is disposed between the fingerprint identification unit and the organic light-emitting display panel; the light-shielding structure comprises at least two light-shielding layers, each of the at least two light-shielding layers comprises light-transmissive portions and at least one light-shielding portion, and the light-transmissive portions are at least partially surrounded by the at least one light-shielding portion; and in a direction perpendicular to the first substrate, positions of light-transmissive portions in one of the at least two light-shielding layers are in one-to-one correspondence with positions of light-transmissive portions in another one of the at least two light-shielding layers;
    wherein the at least two light-shielding layers comprise a first light-shielding layer, a second light-shielding layer, and a third light-shielding layer; the second light-shielding layer is disposed between the first light-shielding layer and the third light-shielding layer; and the first light-shielding layer is disposed between the second light-shielding layer and the fingerprint identification unit; and
    wherein the display device further comprises: a first dielectric layer, a second dielectric layer, and a third dielectric layer, wherein the first dielectric layer is disposed between the fingerprint identification unit and the first light-shielding layer, the second dielectric layer is disposed between the first light-shielding layer and the second light-shielding layer, and the third dielectric layer is disposed between the second light-shielding layer and the third light-shielding layer.

2. The display device of claim 1, wherein in a same light-shielding layer, the at least one light-shielding portion encircles the light-transmissive portions, and the light-transmissive portions are arranged in an array in a first direction and a second direction, wherein the first direction intersects the second direction.

3. The display device of claim 1, further comprising: a lens array disposed between the light-shielding structure and the organic light-emitting display panel;
    wherein the lens array comprises a plurality of converging lenses, and in the direction perpendicular to the first substrate, each of the plurality of converging lenses covers at least one of the light-transmissive portions in a same one of the at least two light-shielding layers.

4. The display device of claim 3, wherein each of the plurality of converging lenses is hemispherical in shape, and the plurality of converging lenses are arranged in an array in a first direction and a second direction, wherein the first direction intersects the second direction.

5. The display device of claim 4, wherein each of the plurality of converging lenses has a diameter of D1, and 8 $\mu m \leq D1 \leq 16$ $\mu m$; and
    each of the light-transmissive portions is circular in shape and has a diameter of D2, and 2 $\mu m \leq D2 \leq 5$ $\mu m$.

6. The display device of claim 3, wherein the fingerprint identification assembly comprises a plurality of fingerprint identification units; and in the direction perpendicular to the first substrate, a number of converging lenses covered by each of fingerprint identification units is greater than or equal to six and is less than or equal to nine.

7. The display device of claim 1, wherein the light-shielding structure and the fingerprint identification unit are both disposed between the first substrate and the organic light-emitting display panel.

8. The display device of claim 7, further comprising: a lens array disposed between the light-shielding structure and the organic light-emitting display panel;
    wherein the lens array comprises a plurality of converging lens, and in the direction perpendicular to the first substrate, each of the plurality of converging lenses covers at least one of the light-transmissive portions in a same one of the at least two light-shielding layers; and
    wherein the lens array is integrated on the first substrate.

9. The display device of claim 7, further comprising: a lens array disposed between the light-shielding structure and the organic light-emitting display panel, wherein the lens array comprises a plurality of converging lens, and in the direction perpendicular to the first substrate, each of the plurality of converging lenses covers at least one of the light-transmissive portions in a same one of the at least two light-shielding layers; and
    a second substrate disposed between the light-shielding structure and the organic light-emitting display panel, wherein the second substrate comprises a plurality of first grooves, and each of the plurality of converging lenses is disposed in a respective one of the plurality of first grooves.

10. The display device of claim 9, further comprising: a first encapsulant which is annular in shape;
    wherein in the direction perpendicular to the first substrate, the first encapsulant is disposed between the second substrate and the light-shielding structure.

11. The display device of claim 9, further comprising: a second encapsulant which is annular in shape;
wherein in the direction perpendicular to the first substrate, the second encapsulant is disposed between the light-shielding structure and the fingerprint identification unit.

12. The display device of claim 1, wherein the light-shielding structure and the fingerprint identification unit are both disposed on a side of the first substrate facing away from the organic light-emitting display panel.

13. The display device of claim 12, further comprising: a lens array disposed between the light-shielding structure and the organic light-emitting display panel;
wherein the lens array comprises a plurality of converging lens, and in the direction perpendicular to the first substrate, each of the plurality of converging lenses covers at least one of the light-transmissive portions in a same one of the at least two light-shielding layers; and
wherein the first substrate comprises a plurality of second grooves, and each of the plurality of converging lens is disposed in a respective one of the plurality of second grooves.

14. The display device of claim 1, wherein
in the direction perpendicular to the first substrate, a sum of a thickness of the first dielectric layer, a thickness of the second dielectric layer and a thickness of the third dielectric layer is greater than or equal to 9 μm.

15. A manufacturing method of a display device, comprising:
providing an organic light-emitting display panel;
providing a first substrate;
forming a fingerprint identification unit and a light-shielding structure on a side of the first substrate; and
securing the first substrate on which the fingerprint identification unit and the light-shielding structure are formed to a non-light-emitting display side of the organic light-emitting display, panel;
wherein the light-shielding structure is disposed between the fingerprint identification unit and the organic light-emitting display panel; the light-shielding structure comprises at least two light-shielding layers, each of the at least two light-shielding layers comprises light-transmissive portions and at least one light-shielding portion, and the light-transmissive portions are at least partially surrounded by the at least one light-shielding portion; and in a direction perpendicular to the first substrate, positions of light-transmissive portions in one of the at least two light-shielding layers are in one-to-one correspondence with positions of light-transmissive portions in another one of the at least two light-shielding layers; and
wherein forming the fingerprint identification unit and the light-shielding structure on the side of the first substrate comprises: forming the fingerprint identification unit on the side of the first substrate, and sequentially forming a first dielectric layer, a first light-shielding layer, a second dielectric layer, a second light-shielding layer, a third dielectric layer, a third light-shielding layer on a side of the fingerprint identification unit facing away from the first substrate.

16. The manufacturing method of claim 15, after forming the fingerprint identification unit and the light-shielding structure on the side of the first substrate, further comprising:
forming a lens array on a side of the light-shielding structure facing away from the first substrate;
wherein the lens array is disposed between the light-shielding structure and the organic light-emitting display panel, the lens array comprises a plurality of converging lens, and in the direction perpendicular to the first substrate, each of the plurality of converging lenses covers at least one of the light-transmissive portions in a same one of the at least two light-shielding layers.

17. The manufacturing method of claim 15, further comprising:
providing a second substrate;
forming a plurality of first grooves on the second substrate;
forming a lens array in the plurality of first grooves; and
bonding, by a first encapsulant which is annular in shape, the second substrate on which the lens array is formed to the side of the first substrate on which the light-shielding structure is formed;
wherein the lens array is disposed between the light-shielding structure and the organic light-emitting display panel, the lens array comprises a plurality of converging lens, and in the direction perpendicular to the first substrate, each of the plurality of converging lenses covers at least one of the light-transmissive portions in a same one of the at least two light-shielding layers.

18. The manufacturing method of claim 15, after providing the first substrate, further comprising:
forming a plurality of second grooves on the first substrate; and
forming a lens array in the plurality of second grooves;
wherein the lens array is disposed between the light-shielding structure and the organic light-emitting display panel, the lens array comprises a plurality of converging lens, and in the direction perpendicular to the first substrate, each of the plurality of converging lenses covers at least one of the light-transmissive portions in a same one of the at least two light-shielding layers.

19. A manufacturing method of a display device, comprising:
providing an organic light-emitting display panel;
providing a first substrate;
forming a fingerprint identification unit on a side of the first substrate;
providing a second substrate;
forming a plurality of first grooves on the second substrate;
forming a lens array in the plurality of first grooves;
forming a light-shielding structure on a side of the second substrate;
bonding, by a second encapsulant which is annular in shape, the side of the second substrate on which the light-shielding structure is formed to the side of the first substrate on which the fingerprint identification unit is formed; and
securing the first substrate on which the fingerprint identification unit and the light-shielding structure are formed to a non-light-emitting display side of the organic light-emitting display panel;
wherein the light-shielding structure comprises at least two light-shielding layers, each of the at least two light-shielding layers comprises light-transmissive portions and at least one light-shielding portion, and the light-transmissive portions are at least partially surrounded by the at least one light-shielding portion; and in a direction perpendicular to the first substrate, positions of light-transmissive portions in one of the at least two light-shielding layers are in one-to-one correspondence with positions of light-transmissive portions in another one of the at least two light-shielding layers; the lens array is disposed between the light-shielding structure and the organic light-emitting display panel; and the lens array comprises a plurality of converging lens, and in the direction perpendicular to the first substrate, each of the plurality of converging lenses covers at least one of the light-transmissive portions in a same one of the at least two light-shielding layers.

* * * * *